(12) United States Patent
Tanaka

(10) Patent No.: US 7,113,527 B2
(45) Date of Patent: Sep. 26, 2006

(54) METHOD AND APPARATUS FOR LASER IRRADIATION AND MANUFACTURING METHOD OF SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 167 days.

(21) Appl. No.: 10/324,078

(22) Filed: Dec. 20, 2002

(65) Prior Publication Data

US 2004/0136416 A1    Jul. 15, 2004

(30) Foreign Application Priority Data

Dec. 21, 2001    (JP)    ............... 2001-390698

(51) Int. Cl.
*H01H 3/10*    (2006.01)
*H01L 22/26*    (2006.01)

(52) U.S. Cl. ........................ 372/24; 438/795

(58) Field of Classification Search ............ 372/23–24, 372/9; 438/795
See application file for complete search history.

(56) References Cited

U.S. PATENT DOCUMENTS

| | | | |
|---|---|---|---|
| 4,734,550 A | 3/1988 | Imamura et al. | |
| 4,978,970 A * | 12/1990 | Okazaki | 347/241 |
| 5,591,668 A | 1/1997 | Maegawa et al. | |
| 5,643,826 A | 7/1997 | Ohtani et al. | |
| 5,923,962 A | 7/1999 | Ohtani et al. | |
| 6,335,509 B1 * | 1/2002 | Jung | 219/121.77 |
| 6,437,284 B1 * | 8/2002 | Okamoto et al. | 219/121.73 |
| 6,535,535 B1 * | 3/2003 | Yamazaki et al. | 372/43.01 |
| 6,563,843 B1 * | 5/2003 | Tanaka | 372/9 |
| 6,570,125 B1 * | 5/2003 | Suh et al. | 219/121.76 |
| 6,707,614 B1 * | 3/2004 | Tanaka | 359/626 |
| 6,770,546 B1 * | 8/2004 | Yamazaki | 438/487 |
| 2002/0094008 A1 | 7/2002 | Tanaka | |
| 2003/0024905 A1 | 2/2003 | Tanaka | |
| 2003/0153182 A1 | 8/2003 | Yamazaki et al. | |

FOREIGN PATENT DOCUMENTS

| | | |
|---|---|---|
| JP | 01-246819 | 10/1989 |
| JP | 04-282869 | 10/1992 |
| JP | 05-315278 | 11/1993 |
| JP | 07-183540 | 7/1995 |
| JP | 09-102468 | 4/1997 |
| JP | 2000-133593 | 5/2000 |

\* cited by examiner

OTHER PUBLICATIONS

Hara et al., *Ultra-high Performance Poly-Si TFTs on a Glass by a Stable Scanning CW Laser Lateral Crystallization*, AM-LCD '01, Tech. Dig., 2001, pp. 227-230.

*Primary Examiner*—James Menefee
*Assistant Examiner*—Phillip Nguyen
(74) *Attorney, Agent, or Firm*—Eric J. Robinson; Robinson Intellectual Property Law Office, P.C.

(57) ABSTRACT

When CW laser is irradiated on a semiconductor film while being relatively scanned in a fabrication process of a semiconductor device, many crystal grains extending in a scanning direction are formed. The semiconductor film irradiated in this way has characteristics substantially approximate to those of a single crystal in the scanning direction. However, because productivity and uniformity of laser annealing are low, mass-production is difficult. A plurality of laser beams is processed into linear beams and is allowed to possess mutually superposing portions to form a more elongated linear beam and to thus improve productivity. The linear beams the overlapping to one another have a positional relation satisfying a predetermined limitation formula, and uniformity of laser annealing can be remarkably improved.

115 Claims, 16 Drawing Sheets

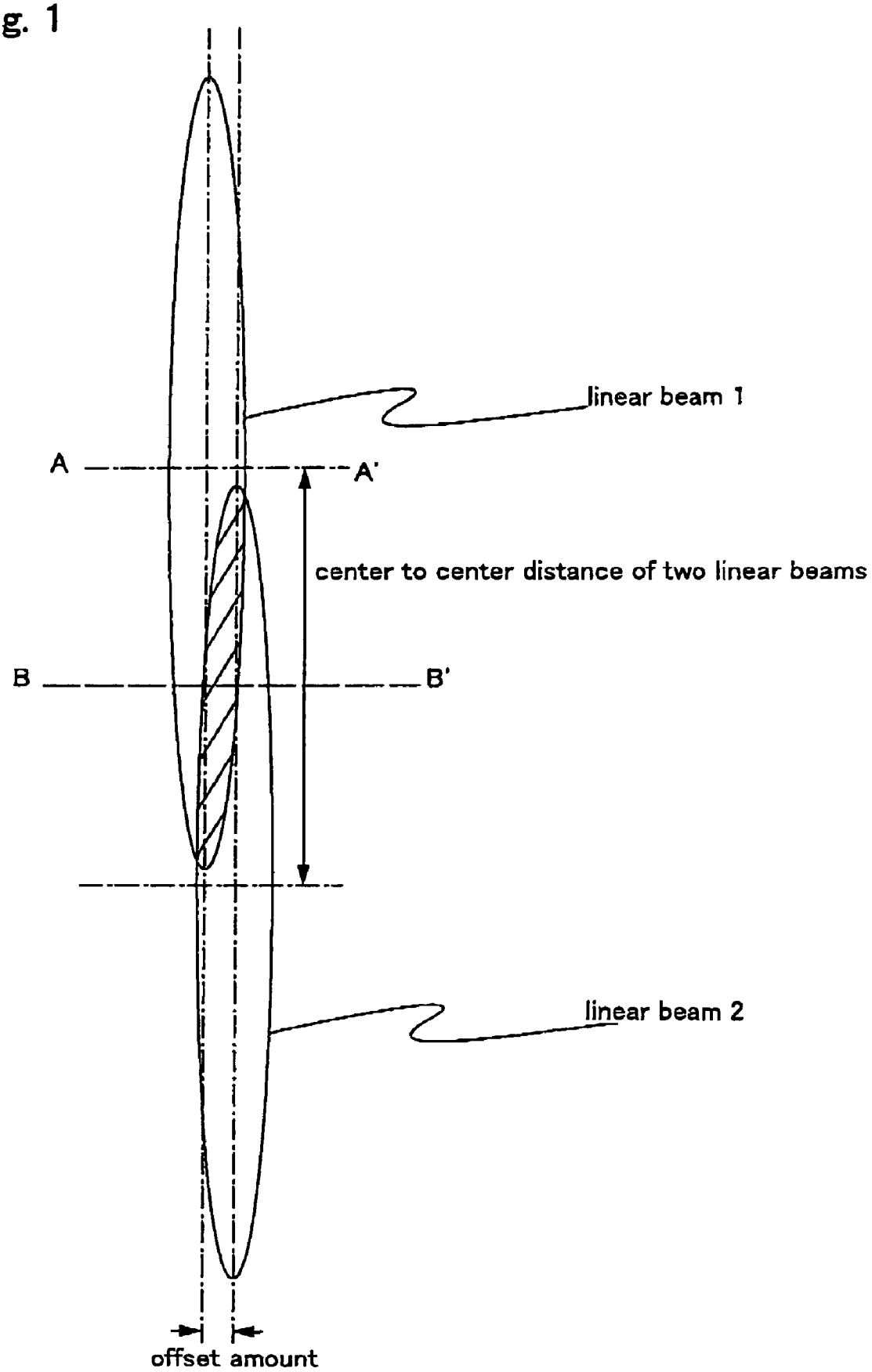

Fig. 2A   A-A' section
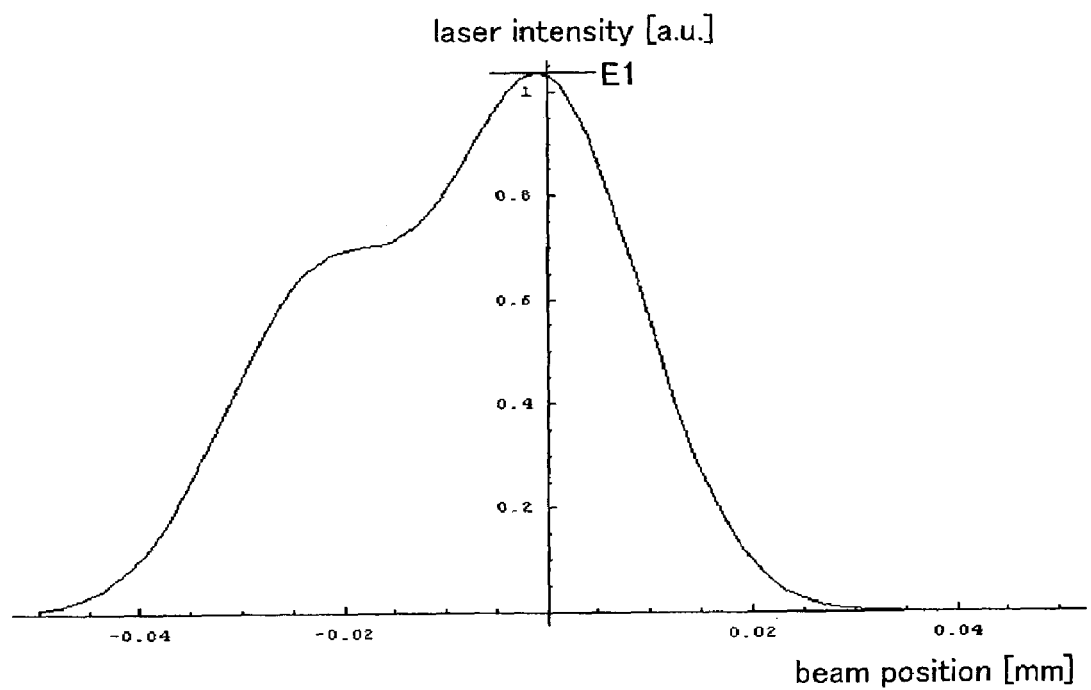
Fig. 2B   B-B' section
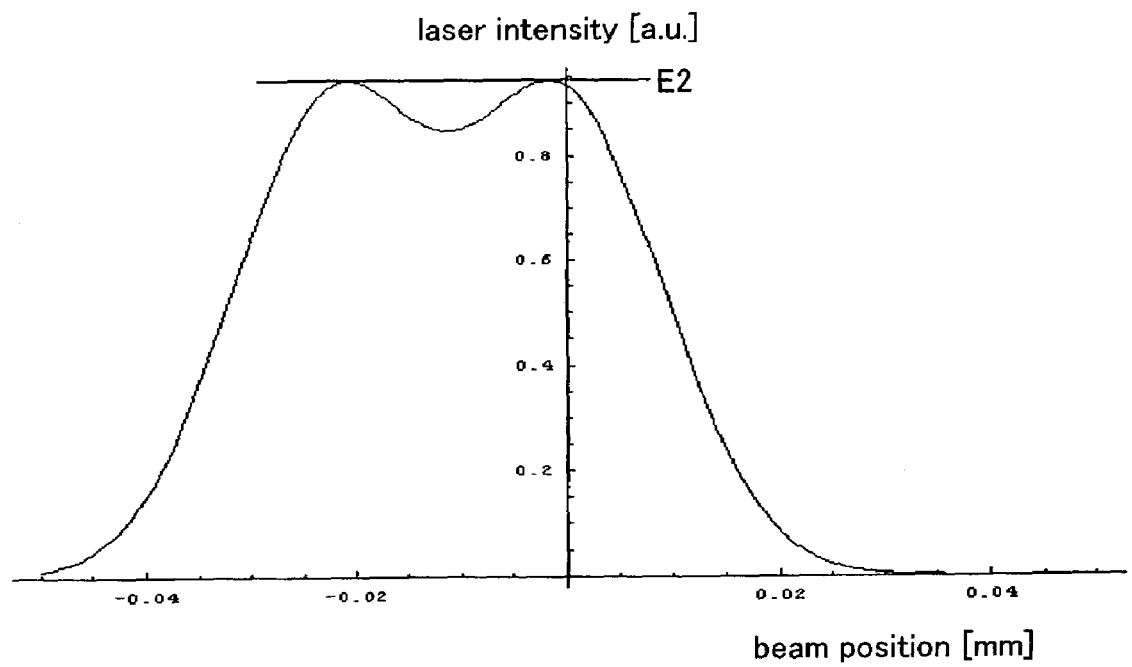

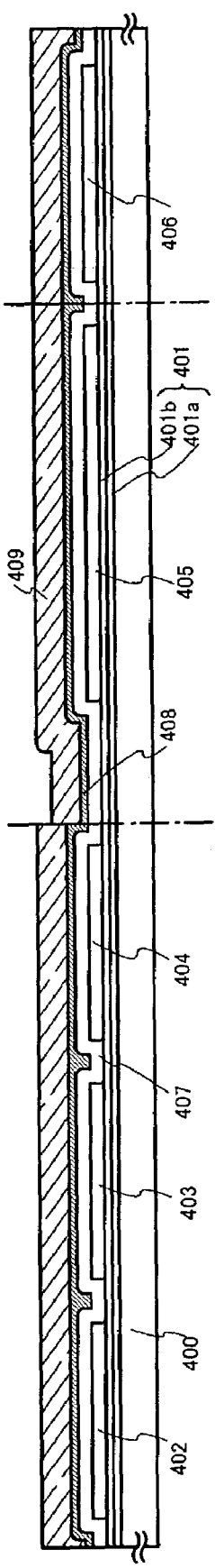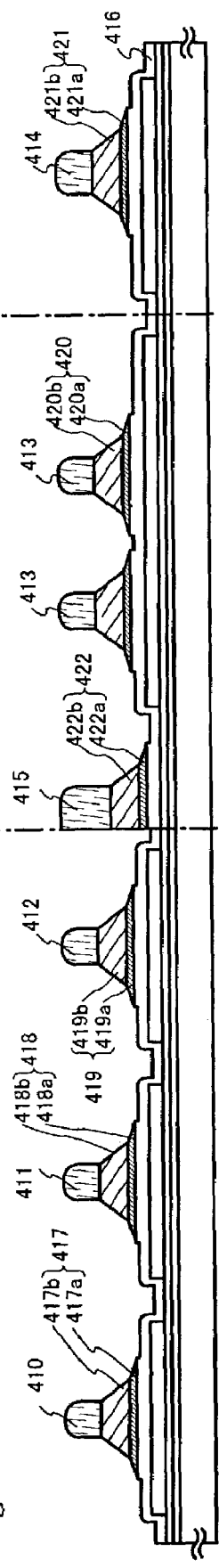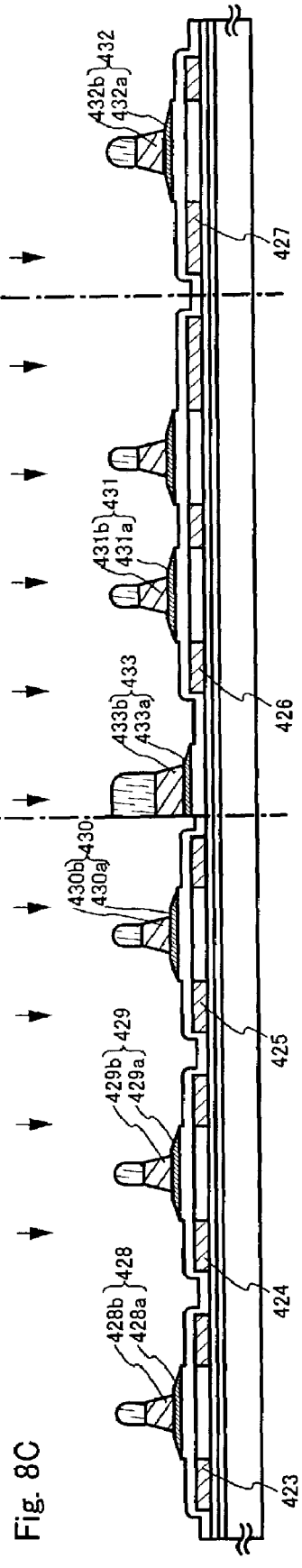

METHOD AND APPARATUS FOR LASER IRRADIATION AND MANUFACTURING METHOD OF SEMICONDUCTOR DEVICE

BACKGROUND OF THE INVENTION

1. Field of the Invention

The present invention relates to an irradiation method of laser light and an irradiation device for conducting the method (the device including a laser oscillation device and an optical system for guiding a laser light outputted to an object to be irradiated). Further, the present invention relates to a method for manufacturing a semiconductor device including steps of crystallization, activation, heating and the like of a semiconductor film. Note that the term semiconductor device mentioned here includes electro-optical devices such as a liquid crystal display device, a light emitting device and an electronic device including the electro-optical device as a component.

2. Description of the Related Art

In recent years, an extensive study has been made on a technique in which an amorphous semiconductor film formed on an insulating substrate made of glass or the like is crystallized so that a semiconductor film having crystal structure (hereafter referred to as crystalline semiconductor film) is obtained. As the methods of crystallization such as a thermal annealing method using furnace annealing, a rapid thermal annealing method (RTA method), a laser annealing method and the like were examined. Anyone thereof or combining two or more methods thereof can be carried out for crystallization.

In comparison with an amorphous semiconductor, a crystalline semiconductor film has extremely high mobility. Since thus, the crystalline semiconductor film is used to form a thin film transistor (referred to as TFT), for example, the TFT can be widely used in an active matrix liquid crystal display device in which TFTs for pixel portion, TFTs for pixel portion and TFTs for driver circuit are formed on one glass substrate.

Generally, in order to crystallize an amorphous semiconductor in annealing furnace, a thermal treatment at 600° C. or more for 10 hours or more is required. A quart is an applicable material of substrate for this crystallization, but the quart substrate is too expensive in price to be manufactured especially in a large area. However, manufacturing the substrate in a large area is given as a way to improve the productivity efficiency, that is why a study has been made on formation of a semiconductor film on a glass substrate which can be manufactured easily in a large area at a low price. It is expected that a substrate in which a length of one side exceeds 1 m will be also used in recent years.

As an example, a method of thermal crystallization by using metal elements disclosed in Japanese Patent Application Laid Open No. 7-183540 enable the crystallization temperature which was a conventional problem to be realized at a low temperature. The crystalline semiconductor film can be formed by this method in which a small amount of an element such as nickel, palladium and lead is added to an amorphous semiconductor film, then the amorphous semiconductor film is heated for four hours at 550° C. 550° C. is a temperature under the strain point of a glass substrate, therefore, there is no worry about a distortion caused thereof.

On the other hand, since the laser annealing method can deliver high energy only to the semiconductor film without substantially increasing the temperature in substrate, the laser annealing technology comes under spotlight by its appliance in a glass substrate with a low strain point as a matter of course, and a plastic substrate, etc.

An example of the laser annealing method is a method for forming pulse laser beam from an excimer laser or the like by an optical system such that it becomes a square spot of several cm or a linear shape of 100 mm or more in length on a surface being illuminated, and relatively shifting an illumination position of the laser beam with respect to the surface being illuminated to conduct annealing. The "linear shape" described here means not a "line" in the strict sense but a rectangle (or a prolate ellipsoid shape or a shape similar thereto) having a high aspect ratio. For example, although, it indicates a shape having an aspect ratio of 2 or more (preferably, 10 to 100), it doesn't make any difference from that a shape at a surface being illuminated is being contained in the laser light having rectangular shape (rectangular shape beam). Note that the linear shape is used to obtain an energy density required for annealing an object sufficiently to be illuminated. Thus, if sufficient annealing is conducted for the object to be illuminated, it may be a rectangular shape and a tabletop shape.

However, a crystalline semiconductor film formed by subjecting an amorphous semiconductor film to laser annealing includes a collection of a plurality of crystal grains, and the position and size of the crystal grains are random. TFTs are formed on a glass substrate by patterning the crystalline semiconductor layer in an island shape for device separation. In this case, the position and size of crystal grains cannot be specified. In comparison with the inner of crystal grains, the interface of crystal grains has an infinite number of a recombination centers or a trapping centers caused by an amorphous structure, a crystal defect, and the like. If the carriers are trapped in trapping centers, potential at a grain boundary will be increased and become barriers to carriers, it is known that current transporting characteristics of carriers will be degraded caused by this. However, it is almost impossible to form a channel formation region by using a single crystal semiconductor film while avoiding the influence of a crystal boundary, although crystal characteristics of semiconductor film of channel formation region have a serious effect on the TFT characteristics.

There is a crystal growth technology reported. In the technology, when a CW laser is illuminated on a semiconductor film with the continuous wave (CW) laser scanning in one direction, crystal grains grow connected in the scanning direction thereof, resulting in forming an infinite number of single crystal grains elongated in that direction. For example, this technology is reported in "Ultra-high Performance Poly-Si TFTs on a Glass by a Stable Scanning CW Laser Lateral Crystallization", A. Hara, F. Takeuchi, M. Takei, K. Yoshino, K. Suga and N. Sasaki, AMLCD '01 Tech. Dig., 2001, pp. 227–230.

It is considered that when this method is applied, a semiconductor film that has no grain boundary at least in a channel direction of a TFT can be formed.

SUMMARY OF THE INVENTION

However, this method uses the CW laser of a wavelength region which is sufficiently absorbed by the semiconductor film. The CW laser, however, is capable of producing an output which is as very small as about 10 watts. From the standpoint of production, therefore, this method is inferior to the technology which uses the excimer laser. The CW laser suited for this method has a large output, has a wavelength shorter than that of a visible ray and has a very high stability in the output. Examples may include second harmonics of an YVO$_4$ laser, second harmonics of a YAG laser, second harmonics of an YLF laser, second harmonics of a glass laser, second harmonics of a YalO$_3$ laser and an Ar laser. However, when the lasers described above are applied to a semiconductor crystallization, there are problems such as the necessity of significantly reducing the laser beam spot in size to fill up a deficiency in output, productivity, laser annealing uniformity and the like. This invention was achieved to solve such defects.

SUMMARY OF THE INVENTION

In a crystallization process of a semiconductor film by using CW laser, a method that processes a laser beam into a thinly elongated shape on an irradiation surface, scans the thinly elongated laser beam (hereinafter called "linear beam") in a direction vertical to a longitudinal direction of the laser beam and crystallizes the semiconductor film has widely been employed in order to improve productivity as much as possible.

The shape of the laser beam emitted from a laser oscillator greatly affects the shape of the thinly elongated laser beam. When a rod used in solid laser has a round shape, for example, the shape of the laser beam emitted has a round shape, too. When elongated, the round laser beam changes to an elliptic laser beam. When the rod used in solid laser has a slab shape, the laser beam emitted has a rectangular shape. When elongated, the laser beam has the rectangular shape. The invention generically calls these beams "linear beams". The term "linear beam" used in the invention represents those beams the length of which in a major direction is at least 10 times the length in a minor direction. When a maximum energy density of the linear beam is defined as 1, the invention defines those beams having energy of e$^{-2}$ or more as the "linear beam". In the invention, further, the term "major diameter" of the linear beam represents the length of the linear beam and the term "minor diameter" does its width.

The invention uses a plurality of laser having small output, shapes the respective laser beams into the linear beams and synthesizes them into a more elongated linear beam so as to improve productivity and uniformity of laser annealing. The invention expresses the degree of synthesis by a numeric value, and provides a laser irradiation apparatus, and a method therefor, having high uniformity of laser annealing, and a production method of a semiconductor device. Hereinafter, the invention will be enumerated.

A construction of a laser irradiation method comprising: extending first and second laser beams emitted from at least first and second laser oscillators wherein each of the first and second laser beams is a round shape having an e$^{-2}$ width of a major diameter a and an e$^{-2}$ width of a minor diameter b; and directing the first and second laser beams to an irradiation surface in order that one edge of the first laser beams in the direction of major diameter overlaps one edge of the second laser beams in the direction of major diameter, wherein a linear laser beam is formed by overlapped first and second laser beams on the irradiation surface, and wherein the following relation is satisfied when center coordinates of the first and second laser beams are (x, y) and (x', y'), respectively, an x axis is drawn in parallel with said major diameter, and y axis is drawn in parallel with the minor diameter:

$$((x-x')/a)^2+((y-y')/b)^2<(R)^2.$$

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Another construction of a laser irradiation method comprising: extending first and second laser beams emitted from at least first and second laser oscillators wherein each of the first and second laser beams is a rectangular shape having an e$^{-2}$ width of a major diameter a and an e$^{-2}$ width of a minor diameter b; and directing the first and second laser beams to an irradiation surface in order that one edge of the first laser beams in the direction of major diameter overlaps one edge of the second laser beams in the direction of major diameter, wherein a linear laser beam is formed by overlapped first and second laser beams on the irradiation surface, wherein the following relation is satisfied when center coordinates of the first and second laser beams are (x, y) and (x', y'), respectively, an x axis is drawn in parallel with said major diameter, and y axis is drawn in parallel with the minor diameter:

$$|y-y'|/b<R \text{ and } |x-x'|<a.$$

In the inequality given above, R is 0.72 and preferably 0.63. This inequality can be applied to a linear beam that exhibits a Gaussian energy distribution in the direction of the minor diameter and has a uniform energy distribution in the direction of the major diameter. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a laser irradiation method comprising: extending first and second laser beams emitted from at least first and second laser oscillators wherein each of the first and second laser beams is a rectangular shape having an e$^{-2}$ width of a major diameter a and an e$^{-2}$ width of a minor diameter b; and directing the first and second laser beams to an irradiation surface in order that one edge of the first laser beams in the direction of major diameter overlaps one edge of the second laser beams in the direction of major diameter, wherein a linear laser beam is formed by overlapped first and second laser beams on the irradiation surface, and wherein the following relation is satisfied when center coordinates of the first and second laser beams are (x, y) and (x', y'), respectively, an x axis is drawn in parallel with said major diameter, and y axis is drawn in parallel with the minor diameter:

$$|x-x'|/a<R \text{ and } |y-y'|<b.$$

In the inequality given above, R is 0.72 and preferably 0.63. This inequality can be applied to a linear beam that exhibits a Gaussian energy distribution in the direction of the major diameter and has a uniform energy distribution in the direction of the minor diameter. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a laser irradiation method comprising: extending first and second laser beams emitted from at least first and second laser oscillators wherein each of the first and second laser beams is a round shape having an e$^{-2}$ width of a major diameter a and an e$^{-2}$ width of a minor diameter b; and directing the first and second laser beams to an irradiation surface in order that one edge of the first laser beams in the direction of major diameter overlaps one edge of the second laser beams in the direction of major diameter, wherein a linear laser beam is formed by overlapped first and second laser beams on the irradiation surface, and wherein the following relation is satisfied when center coordinates of the first and second laser beams are (x, y) and (x', y'), respectively, an x axis is drawn in parallel with said major diameter, and y axis is drawn in parallel with the minor diameter:

$|x-x'|/a<R$ and $|y-y'|/b<R$.

In the inequality given above, R is 0.72 and preferably 0.63. This inequality can be applied to a linear beam that exhibits a Gaussian energy distribution in the direction of the minor diameter and a Gaussian energy distribution in the direction of the major diameter, too. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a laser irradiation method comprising: extending first and second laser beams emitted from at least first and second laser oscillators wherein the first laser beam is a round shape and the second laser beams is a rectangular shape, each of which having an $e^{-2}$ width of a major diameter a and an $e^{-2}$ width of a minor diameter b; and directing the first and second laser beams to an irradiation surface in order that one edge of the first laser beams in the direction of major diameter overlaps one edge of the second laser beams in the direction of major diameter, wherein a linear laser beam is formed by overlapped first and second laser beams on the irradiation surface, and wherein the following relation is satisfied when center coordinates of the first and second laser beams are (x, y) and (x', y'), respectively, an x axis is drawn in parallel with said major diameter, and y axis is drawn in parallel with the minor diameter:

$((x-x')/a)^2+((y-y')/b)^2<(R)^2$.

In the inequality given above, R is 0.72 and preferably 0.63. Outside the range of this inequality, a region where grains of thinly elongated single crystal are not formed develops:between the overlapping linear beams. Consequently, regions of the semiconductor film having high characteristics do not continue in succession, and the technical meaning of forming one beam is lost.

In the invention, when the relation $0.52<|x-x'|/a$ is satisfied, the linear beam can be more elongated. Therefore, productivity can be advantageously improved.

In the invention, when the relation b<50 μm is satisfied, the linear beam can be more elongated. Therefore, productivity can be advantageously improved.

In the constructions of the invention described above, the laser is continuous wave gas laser, solid laser or metal laser. The gas laser includes Ar laser, Kr laser and $CO_2$ laser. The solid laser includes YAG laser, $YVO_4$ laser, YLF laser, $YalO_3$ laser, $Y_2O_3$ laser, glass laser, ruby laser, alexandrite laser, Ti:sapphire laser, and so forth. The metal laser includes helium cadmium laser, copper vapor laser and gold vapor laser. Excimer laser is generally pulse oscillation, but a theory goes that continuous wave is also possible in principle. If such excimer laser is available, excimer laser of continuous wave can be applied to the invention.

In the constructions of the invention described above, the laser beam is converted to higher harmonics by a non-linear optical device. Crystal used for the non-linear optical device is, for example, those called "LBO", "BBO", "KDP", "KTP", "KB5" and "CLBO" because they are excellent in conversion efficiency. When these non-linear optical devices are put into a resonator of laser, conversion efficiency can be drastically improved.

In the constructions of the invention described above, energy uniformity of the resulting elongated beam can be desirably improved when the laser beam is oscillated in $TEM_{00}$.

A construction of a laser irradiation apparatus comprising: at least first and second laser oscillators; and means for extending first and second laser beams emitted from the first and second laser oscillators, respectively, each of the first and second laser beams having a round spot shape, wherein one edge of the first laser beams in the direction of major diameter overlaps one edge of the second laser beams in the direction of major diameter, and a linear laser beam is formed by overlapped first and second laser beams on an irradiation surface, and wherein the following relation is satisfied when an $e^{-2}$ width of a major diameter of each of the extended first and second laser beams on the irradiation surface is a, an $e^{-2}$ width of a minor diameter is b, an x axis is drawn in parallel with the major diameter, a y axis is drawn in parallel with the minor diameter, and center coordinates of the first and second laser beams are (x, y) and (x', y'), respectively:

$((x-x')/a)^2+((y-y')/b)^2<R^2$

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Another construction of a laser irradiation apparatus comprising: at least first and second laser oscillators; and means for extending first and second laser beams emitted from the first and second laser oscillators, respectively, each of the first and second laser beams having a rectangular spot shape, wherein one edge of the first laser beams in the direction of major diameter overlaps one edge of the second laser beams in the direction of major diameter, and a linear laser beam is formed by overlapped first and second laser beams on an irradiation surface, and wherein the following relation is satisfied when an $e^{-2}$ width of a major diameter of each of the extended first and second beams on the irradiation surface is a, an $e^{-2}$ width of a minor diameter is b, an x axis is drawn in parallel with the major diameter, a y axis is drawn in parallel with the minor diameter, and center coordinates of the first and second laser beams are (x, y) and (x', y'), respectively:

$|y-y'|/b<R$ and $|x-x'|<a$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a laser irradiation apparatus comprising: at least first and second laser oscillators; and means for extending first and second laser beams emitted from the first and second laser oscillators, respectively, each of the first and second laser beams having a rectangular spot shape, wherein one edge of the first laser beams in the direction of major diameter overlaps one edge of the second laser beams in the direction of major diameter, and a linear laser beam is formed by overlapped first and second laser beams on an irradiation surface, and wherein the following relation is satisfied when an $e^{-2}$ width of a major diameter of each of the extended first and second beams on the irradiation surface is a, an $e^{-2}$ width of a minor diameter is b, an x axis is drawn in parallel with the major diameter, a y axis is drawn in parallel with the minor diameter, and center coordinates of the first and second laser beams are (x, y) and (x', y'), respectively:

$|x-x'|/a<R$, and $|y-y'|<b$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a laser irradiation apparatus comprising: at least first and second laser oscillators; and means for extending first and second laser beams emitted from the first and second laser oscillators, respectively, each of the first and second laser beams having a rectangular spot shape, wherein one edge of the first laser beams in the direction of major diameter overlaps one edge of the second laser beams in the direction of major diameter, and a linear laser beam is formed by overlapped first and second laser beams on an irradiation surface, and wherein the following relation is satisfied when an $e^{-2}$ width of a major diameter of each of the extended first and second beams on the irradiation surface is a, an $e^{-2}$ width of a minor diameter is b, an x axis is drawn in parallel with the major diameter, a y axis is drawn in parallel with the minor diameter, and center coordinates of the first and second laser beams are (x, y) and (x', y'), respectively:

$|x-x'|/a<R$, and $|y-y'|/b<R$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of laser irradiation apparatus comprising: at least first and second laser oscillators; and means for extending first and second laser beams emitted from the first and second laser oscillators, respectively, the first laser beam having a rectangular spot shape and the second laser beam having a round spot shape, wherein one edge of the first laser beams in the direction of major diameter overlaps one edge of the second laser beams in the direction of major diameter, and a linear laser beam is formed by overlapped first and second laser beams on an irradiation surface, and wherein the following relation is satisfied when an $e^{-2}$ width of a major diameter of each of the extended first and second beams on the irradiation surface is a, an $e^{-2}$ width of a minor diameter is b, an x axis is drawn in parallel with the major diameter, a y axis is drawn in parallel with the minor diameter, and center coordinates of the first and second laser beams are (x, y) and (x', y'), respectively:

$((x-x')/a)^2+((y-y')/b)^2<R^2$

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Another construction of manufacturing method of a semiconductor device comprising: forming a semiconductor film comprising silicon over a substrate; extending first and second laser beams emitted from at least first and second laser oscillators wherein each of the first and second laser beams is a round shape having an $e^{-2}$ width of a major diameter a and an $e^{-2}$ width of a minor diameter b; and directing the first and second laser beams to the semiconductor film in order that one edge of the first laser beams in the direction of major diameter overlaps one edge of the second laser beams in the direction of major diameter, wherein a linear laser beam is formed by overlapped first and second laser beams on the semiconductor film, and wherein the lo following relation is satisfied when center coordinates of the first and second laser beams are (x, y) and (x', y'), respectively, an x axis is drawn in parallel with said major diameter, and y axis is drawn in parallel with the minor diameter:

$((x-x')/a)^2+((y-y')/b)^2<R^2$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Another construction of a manufacturing method of a semiconductor device comprising: forming a semiconductor film comprising silicon over a substrate; extending first and second laser beams emitted from at least first and second laser oscillators wherein each of the first and second laser beams is a rectangular shape having an $e^{-2}$ width of a major diameter a and an $e^{-2}$ width of a minor diameter b; and directing the first and second laser beams to the semiconductor film in order that one edge of the first laser beams in the direction of major diameter overlaps one edge of the second laser beams in the direction of major diameter, wherein a linear laser beam is formed by overlapped first and second laser beams on the semiconductor film, wherein the following relation is satisfied when center coordinates of the first and second laser beams are (x, y) and (x', y'), respectively, an x axis is drawn in parallel with said major diameter, and y axis is drawn in parallel with the minor diameter:

$|y-y'|/b<R$, and $|x-x'|<a$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of manufacturing method of a semiconductor device comprising: forming a semiconductor film comprising silicon over a substrate; extending first and second laser beams emitted from at least first and second laser oscillators wherein each of the first and second laser beams is a rectangular shape having an $e^{-2}$ width of a major diameter a and an $e^{-2}$ width of a minor diameter b; and directing the first and second laser beams to the semiconductor film in order that one edge of the first laser beams in the direction of major diameter overlaps one edge of the second laser beams in the direction of major diameter, wherein a linear laser beam is formed by overlapped first and second laser beams on the semiconductor film, wherein the following relation is satisfied when center coordinates of the first and second laser beams are (x, y) and (x', y'), respectively, an x axis is drawn in parallel with said major diameter, and y axis is drawn in parallel with the minor diameter:

$|x-x'|/a<R$, and $|y-y'|<b$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a manufacturing method of a semiconductor device comprising: forming a semiconductor film comprising silicon over a substrate; extending first and second laser beams emitted from at least first and second laser oscillators wherein each of the first and second laser beams is a round shape having an $e^{-2}$ width of a major diameter a and an $e^{-2}$ width of a minor diameter b; and directing the first and second laser beams to the semiconductor film in order that one edge of the first laser beams in the direction of major diameter overlaps one edge of the second laser beams in the direction of major diameter, wherein a linear laser beam is formed by overlapped first and second laser beams on the semiconductor film, wherein the following relation is satisfied when center coordinates of the first and second laser beams are (x, y) and (x', y'), respectively, an x axis is drawn in parallel with said major diameter, and y axis is drawn in parallel with the minor diameter:

$|x-x'|/a<R$, and $|y-y'|/b<R$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

Still another construction of a manufacturing method of a semiconductor device comprising: forming a semiconductor film comprising silicon over a substrate; extending first and second laser beams emitted from at least first and second laser oscillators wherein the first laser beam is a round shape and the second laser beams is a rectangular shape, each of which having an $e^{-2}$ width of a major diameter a and an $e^{-2}$ width of a minor diameter b; and directing the first and second laser beams to an irradiation surface in order that one edge of the first laser beams in the direction of major diameter overlaps one edge of the second laser beams in the direction of major diameter, wherein a linear laser beam is formed by overlapped first and second laser beams on the irradiation surface, and wherein the following relation is satisfied when center coordinates of the first and second laser beams are (x, y) and (x', y'), respectively, an x axis is drawn in parallel with said major diameter, and y axis is drawn in parallel with the minor diameter:

$((x-x')/a)^2+((y-y')/b)^2<R^2$.

In the inequality given above, R is 0.72 and preferably 0.63. Outside the range of this inequality, a region where grains of thinly elongated single crystal are not formed develops between the overlapping linear beams. Consequently, regions of the semiconductor film having high characteristics do not continue in succession, and the technical meaning of forming one beam is lost.

In the constructions of the invention described above, when the relation $0.52<|x-x'|/a$ is satisfied, the linear beam can be more elongated. Therefore, productivity can be advantageously improved.

In the constructions of the invention described above, the laser is continuous wave gas laser, solid laser or metal laser. The gas laser includes Ar laser, Kr laser and $CO_2$ laser. The solid laser includes YAG laser, $YVO_4$ laser, YLF laser, $YalO_3$ laser, glass laser, ruby laser, alexandrite laser, Ti:sapphire laser. The metal laser includes helium cadmium laser, copper vapor laser and gold vapor laser. Excimer laser is generally pulse oscillation, but a theory goes that continuous wave is also possible in principle. If such excimer laser is available, excimer laser of continuous wave can be applied to the invention.

In the constructions of the invention described above, the laser beam is converted to higher harmonics by a non-linear optical device. Crystal used for the non-linear optical device is, for example, those called "LBO", "BBO", "KDP", "KTP", "KB5" and "CLBO" because they are excellent in conversion efficiency. When these non-linear optical devices are put into a resonator of laser, conversion efficiency can be drastically improved.

In the constructions of the invention described above, energy uniformity of the resulting elongated beam can be preferably improved when the laser beam is oscillated in $TEM_{00}$.

In this specification, the term "Gaussian energy distribution" means that an energy profile of the laser beam on the irradiation surface exhibits a Gaussian distribution or a shape analogous to the Gaussian distribution.

Laser annealing can be uniformly conducted when a plurality of laser beams satisfying the formula of the invention is irradiated to the semiconductor film. The invention is particularly suitable for crystallizing semiconductor films, for improving crystallinity and for activating impurity elements. Because the invention synthesizes a plurality of laser beams with one another, the invention can improve throughput. The invention can improve operation characteristics of a semiconductor device and its reliability in the semiconductor device utilizing the invention as typified by an active matrix type liquid crystal display device. Because the invention does not use gas laser that has been used in the laser annealing method according to the prior art but can use solid laser, the invention can reduce the production cost of semiconductor devices.

BRIEF DESCRIPTION OF THE DRAWINGS

FIG. 1 is an explanatory view useful for explaining an embodiment 1 of the invention;

FIGS. 2A and 2B are explanatory views useful for explaining the embodiment 1 of the invention;

FIGS. 8A to 8C are cross-sectional views showing fabrication processes of pixel TFT and TFT of a driving circuit;

DESCRIPTION OF THE PREFERRED EMBODIMENTS

Embodiment 1:

Embodiment 1 of the invention will be explained with reference to FIGS. 1 to 4 and FIGS. 6 and 7. This embodiment derives a condition that permits uniform laser annealing of a semiconductor film when a plurality of linear beams is superposed with one another to provide a more elongated linear beam.

Figure 4:
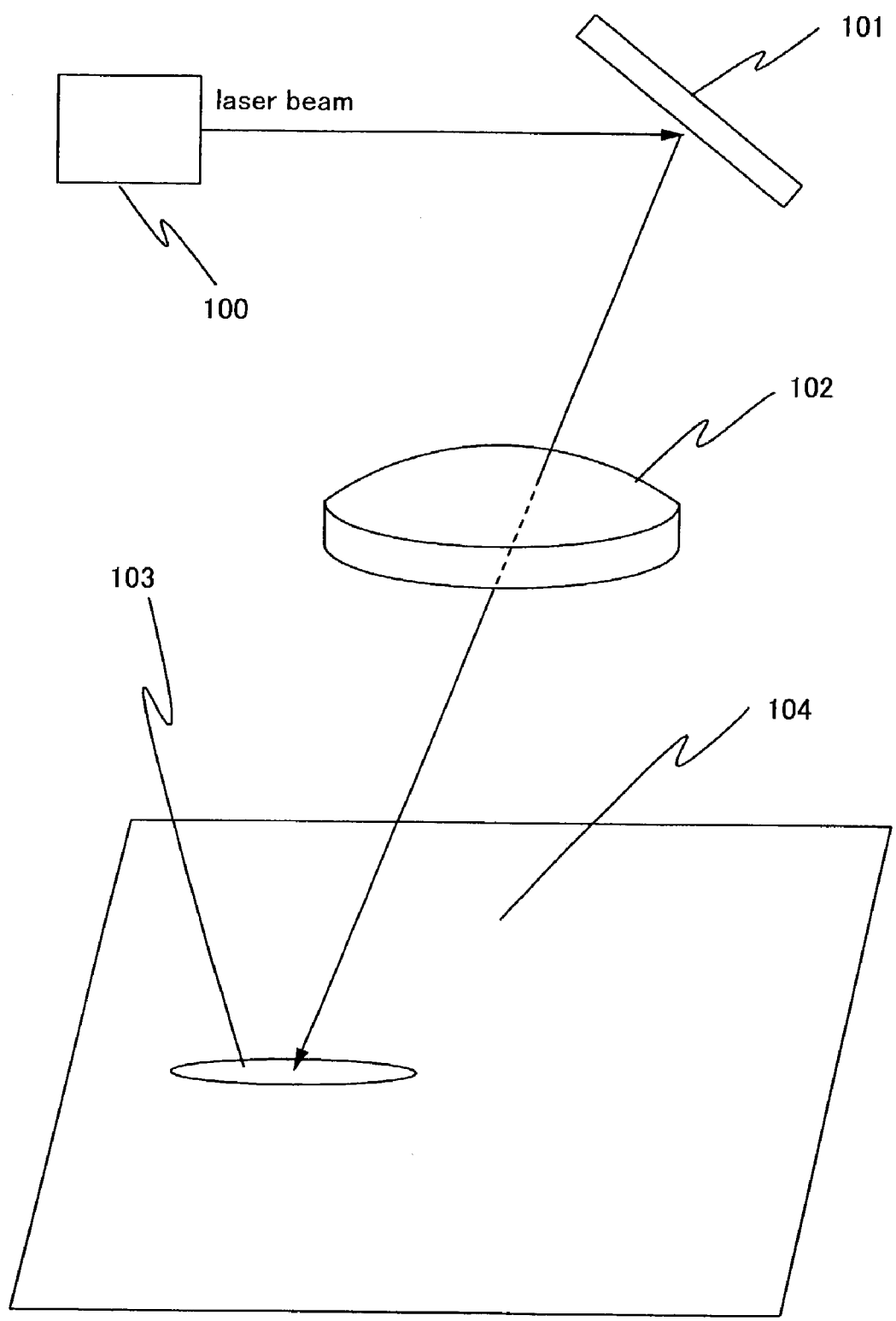
FIG. 4 is an explanatory view useful for explaining the embodiment 1 of the invention.

To begin with, a laser output condition for uniformly irradiating a semiconductor film is calculated. An LD excitation type 10 W laser oscillator 100 (Nd: YVO$_4$ laser, CW, second higher harmonics) is prepared as shown in FIG. 4. The laser oscillator has an LBO crystal built in a resonator in a TEM$_{oo}$ oscillation mode for conversion to the second harmonics. A beam diameter is 2.25 mm. An expansion angle is about 0.3 mrad. A 45° reflecting mirror tilts downward by 20° a traveling direction of the laser beam from a perpendicular direction. Next, the laser beam is allowed to be incident at an angle of 20° into a plano-convex lens 102 having a focal length of 20 mm so that a major diameter of the linear beam 103 attains about 250 μm and a minor diameter does about 40 μm on a semiconductor film surface 104 arranged on a horizontal plane. The planar surface of the plano-convex lens 102 is brought at this time into conformity with the horizontal plane. In consequence, the beam elongated by astigmatism is formed on the semiconductor film 104. The distance from the plano-convex lens 102 to the semiconductor film 104 is adjusted in a 100-μm pitch. This adjustment provides an elongated linear beam 103 in a crossing direction of the surface of incidence with the semiconductor film 104. The positional relation of the lens and the semiconductor film is based hereby on the horizontal plane and the perpendicular direction for ease of explanation, but the invention can of course be executed readily so long as the same positional relation is maintained.

The semiconductor film 104 is formed on a substrate. More concretely, a silicon oxide film having a thickness of about 200 nm is formed on a glass substrate and an amorphous silicon (a-Si) film is formed on the silicon oxide film. To improve laser resistance of the semiconductor film, heat-treatment is carried out in a nitrogen atmosphere at 500° C. for 1 hour.

Figure 3:
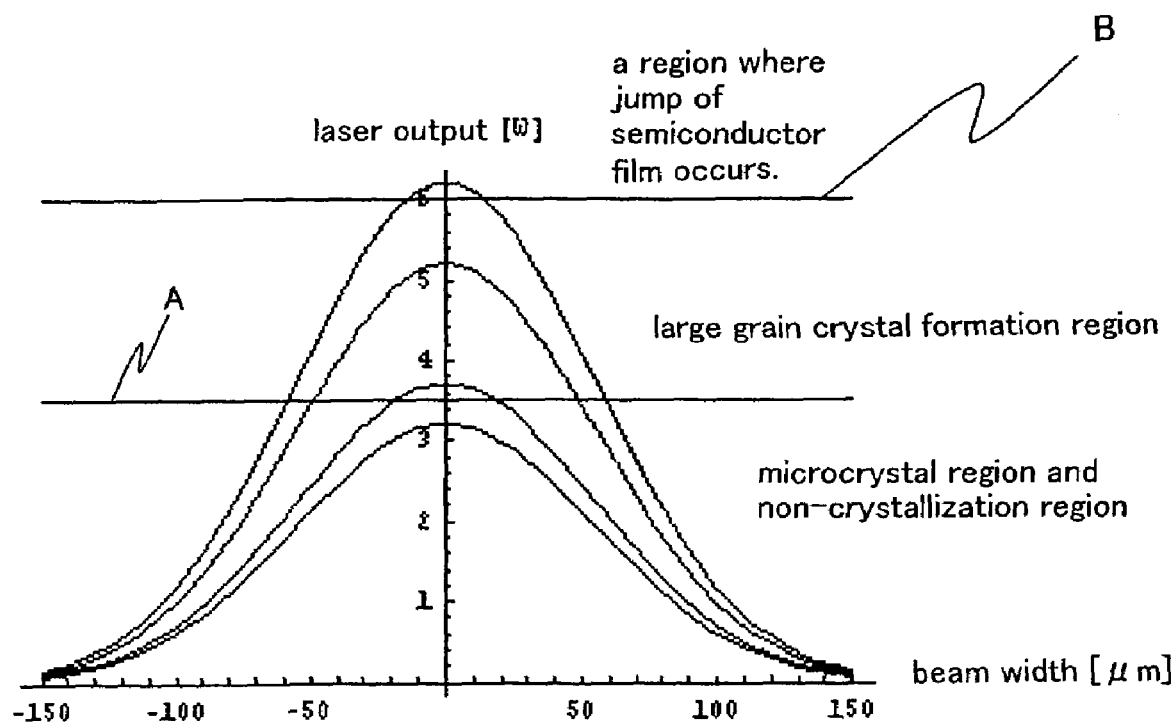
FIG. 3 is an explanatory view useful for explaining the embodiment 1 of the invention.

FIG. 3 shows the relation between the change of the semiconductor film and the laser output when the linear beam 103 is scanned on the semiconductor film 104 in the direction of its minor diameter to anneal the semiconductor film. The abscissa lo represents the direction of the major diameter of the beam and the ordinate does the output of the laser oscillator. A curve in the graph representing the Gaussian distribution indicates an energy distribution in the direction of the major diameter of the linear beam. While the scanning speed is fixed at 50 cm/sec, the laser output is changed from 3.2 W to 6.2 W to examine the change of the semiconductor film. When the laser output is 3.2 W or below, the elongated crystal grains described above are not at all formed. When the laser output reaches 3.7 W, many elongated single crystal grains are formed over a width of about 40 μm. A region covered with the elongated single crystal grains will be hereinafter called a "large grain crystal formation region". As the laser output is raised to 5.2 W and then to 6.2 W, the width becomes greater and reaches 100 μm and 120 μm, respectively. When the laser beam is raised to 6.2 W, the semiconductor film jumps at the center of the laser beam at which the laser output attains the highest. The width of the region in which the semiconductor jumps is about 20 μm. The result given above makes it possible to stipulate the range of the laser output in which the large grain crystal formation region is formed in FIG. 3. In other words, a horizontal long line A at the center in FIG. 3 represents a threshold value of the laser output at which the large grain crystal formation region is formed and a horizontal long line B above the line A represents a threshold value of the laser output at which the semiconductor film jumps and cannot be used in practice.

It can be understood from the result of this experiment that the large grain crystal formation region uniformly expanding in the direction of the major diameter of the linear beam can be acquired when a linear beam whose maximum energy value in its energy distribution in the section of the linear beam in the direction of the minor diameter of the linear beam exists between the lines A and B is formed. If any energy distribution exceeding the line B exists in the direction of the major diameter of the linear beam, jump of the semiconductor film occurs and uniform laser annealing cannot be conducted. If the energy distribution below the line A exists at a position cutting the direction of the major diameter of the linear beam in the major diameter direction, a microcrystal region or a non-crystallization region where the grains are not crystallized is formed between two large grain crystal formation region. Therefore, uniform laser annealing cannot be conducted, either.

To synthesize a plurality of linear beams to thereby form a more elongated linear beam and to conduct uniform laser annealing, the energy distribution of the synthesized linear beam must fall between the lines A and B. When an energy distribution within ±25% exists in terms of a numerical value, a laser output that permits uniform laser annealing exists. This will be explained with reference to FIGS. 1 and 2.

FIG. 1 shows the condition where two linear beams are brought overlapping to each other and are superposed. FIG. 2A shows an energy distribution in a section A–A' at the center of the linear beam 1. FIG. 2B shows an energy distribution in a section B–B' between the linear beams 1 and 2. Assuming that maximum energy in each section is E1, E2, uniform laser annealing can be conducted when the following condition is satisfied:

$$|E1-E2|/|E1+E2| \leq 0.25 \quad (1)$$

However, an energy margin is extremely small under such a condition. Therefore, uniform laser annealing can be conducted more reliably when the following condition is satisfied by way of precaution:

$$|E1-E2|/|E1+E2| \leq 0.10 \quad (2)$$

Figure 6:
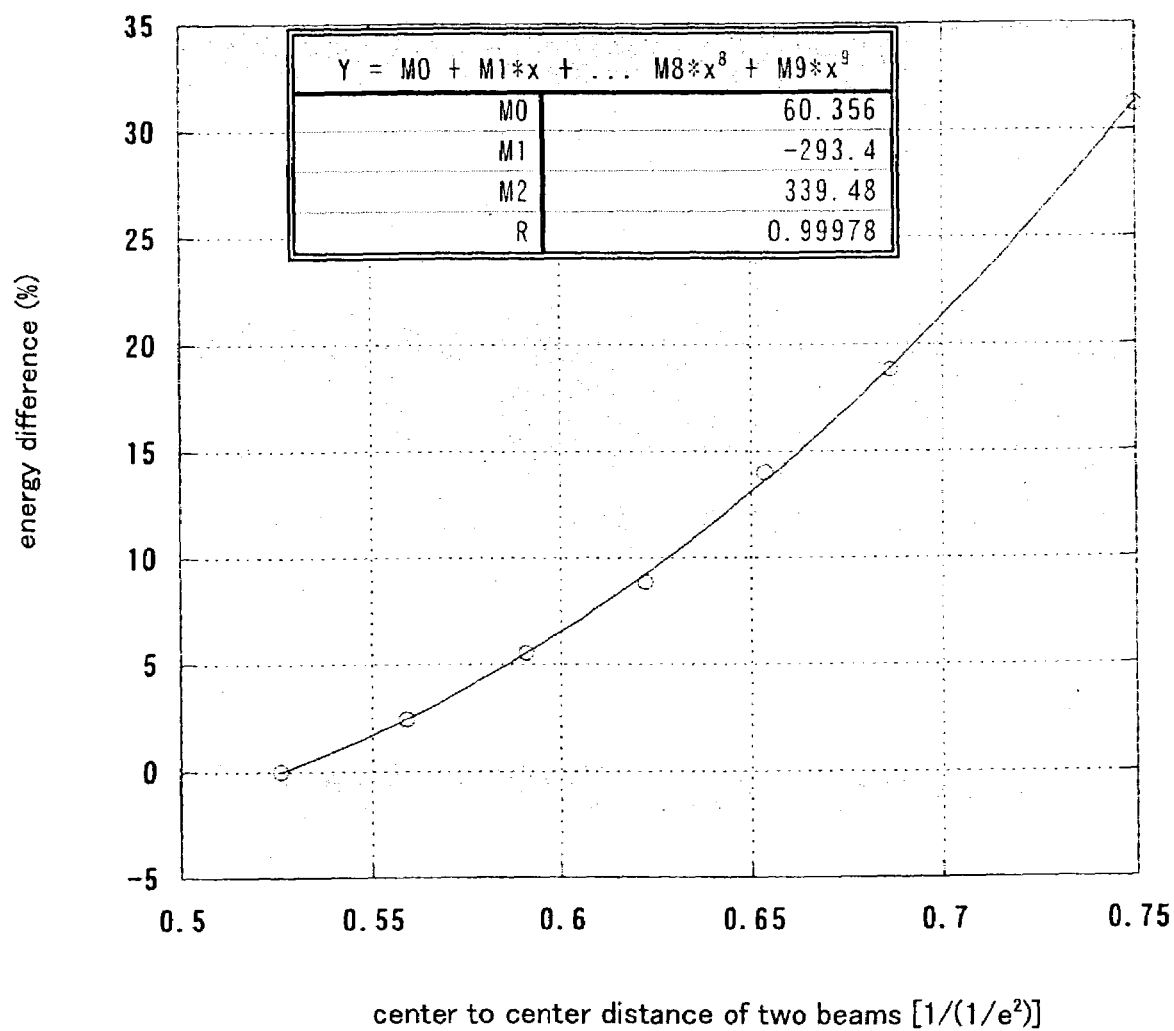
FIG. 6 is an explanatory view useful for explaining the embodiment 1 of the invention.
Figure 7:
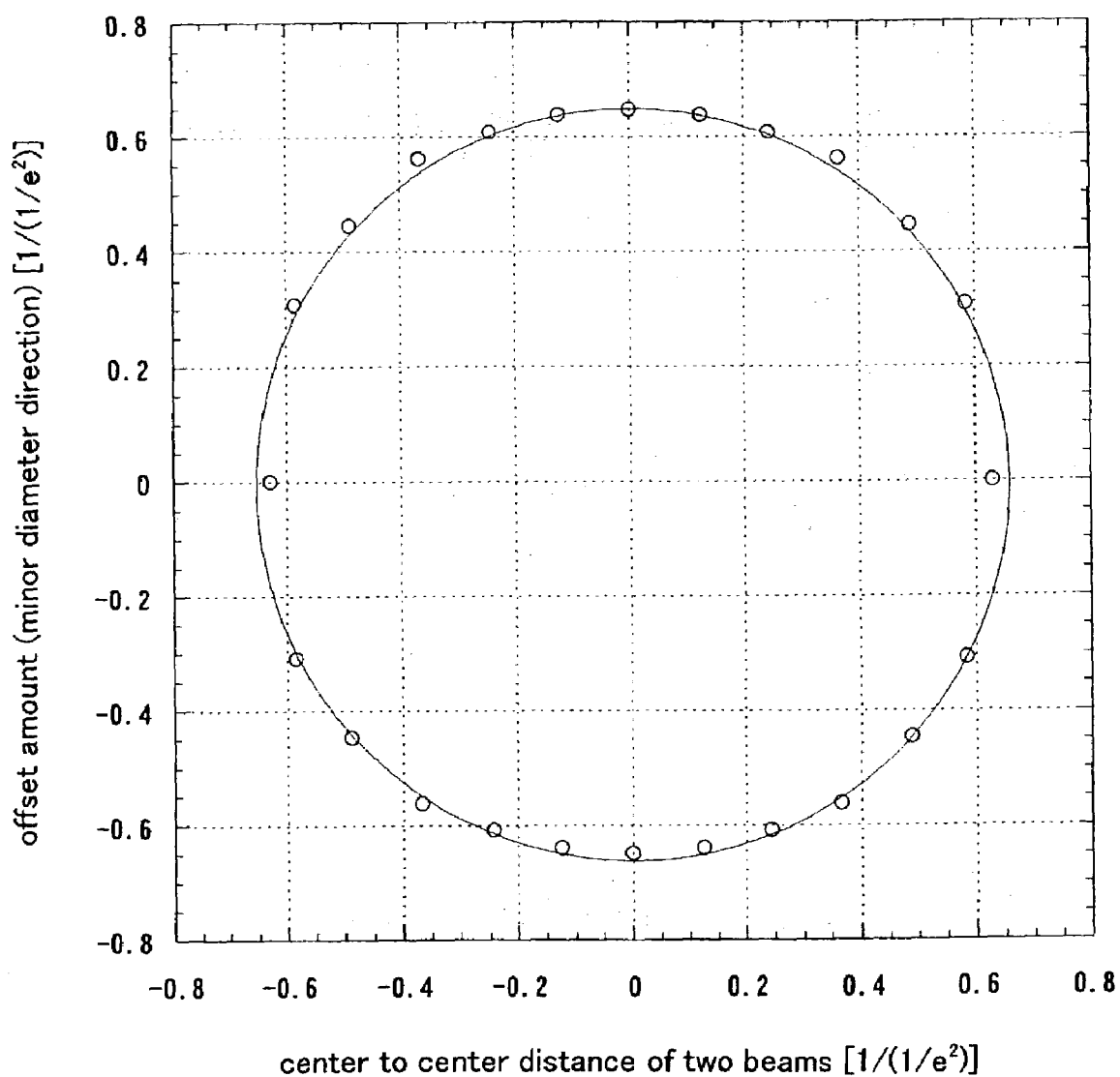
FIG. 7 is an explanatory view useful for explaining the embodiment 1 of the invention.

FIG. 6 shows the result of calculation of the center-to-center distance of the two linear beams overlapping to each other at which the condition of the relation 1) or 2) can be satisfied. The graph in FIG. 6 represents the difference between energy E1 and energy E2 when the offset amount in FIG. 1 is zero (0). In other words, the ordinate is |E1−E2|/|E|+E2|×100(%). It can be understood from the graph in FIG. 6 that the center-to-center distance of the two linear beams satisfying the relation 1) is 0.72 or below, and the center-to-center distance satisfying the relation 2) is 0.63 or below. Here, the distance is normalized by an $e^{-2}$ width of the major diameter of the linear beam. The energy difference between E1 and E2 becomes zero (0) when the center-to-center distance is 0.52 or below. It is irrational to further bring the two beams closer to each other beyond this level because only the length of the linear beams is decreased. Therefore, the center-to-center distance is preferably at least 0.52.

Laser annealing can be conducted more uniformly when a plurality of linear beams satisfying the relation of the invention is irradiated to the semiconductor film. The invention is particularly suitable for crystallizing the semiconductor film, for improving crystallinity and for activating impurity elements. When a plurality of linear beams is partially synthesized with one another and optimized, a uniform laser beam can be formed in the direction of the major diameter with the result of improvement of through-put. A crystalline semiconductor film having higher uniformity can be formed when the semiconductor film is crystallized by use of the laser beam having such high uniformity, and variance of electrical characteristics of TFT can be reduced. The invention can further improve operation performance of semiconductor devices and their reliability in semiconductor devices typified by an active matrix type liquid crystal display device utilizing the invention. Since the invention does not use a gas laser as in the laser annealing method according to the prior art but can use a solid laser, the invention can reduce the production cost of the semiconductor devices.

Embodiment 2:

This embodiment represents an example where four sets of lasers are synthesized to form a more elongated linear beam. The embodiment represents also an example where the semiconductor film is laser annealed by using such an apparatus.

Figure 5:
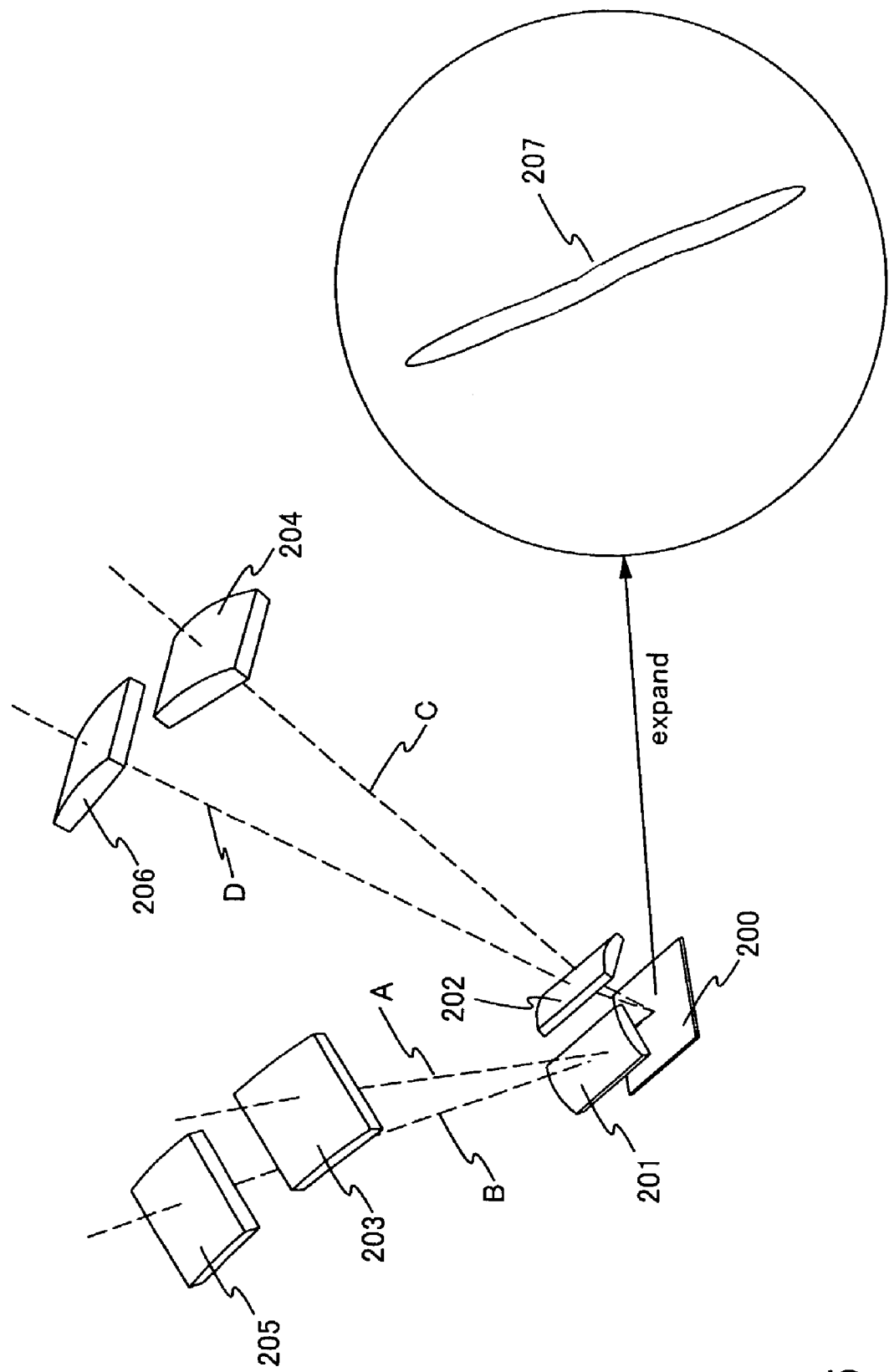
FIG. 5 is an explanatory view useful for explaining an embodiment 2 of the invention.

First, a method of forming an elongated linear beam by use of four laser oscillators will be explained with reference to FIG. 5. Cylindrical lenses 201 and 202 are plano-convex lenses having a focal length of 20 mm. The lenses are symmetrically arranged with their buses being parallel to one other with respect to a plane that includes the major diameter of the linear beam on a plane 200 on which the linear beam is formed, and is vertical to the plane 200. The surface of each cylindrical lens having curvature faces up. The bus is parallel to the major diameter at this time. The cylindrical lenses 201 and 202 are tilted at an angle of 25° to the plane 200. The cylindrical lenses are tilted so that four linear beams that are by far smaller than an optical device can be formed in superposition on the irradiation surface 200.

Plano-convex cylindrical lenses 203 and 205 having a focal length of 150 mm are arranged on the plane including the major diameter of the linear beam and vertical to the planar surface portion of the cylindrical lens 201 in such a fashion as to include an optical axis A and an optical axis B. An angle between the optical axis A and the major diameter is 80° and an angle between the optical axis B and the major diameter is 80°, too. The planar surface portion of the cylindrical lens 203 and the optical axis A are vertical, and the planar surface portion of the cylindrical lens 205 and the optical axis B are vertical. The optical path length from each cylindrical lens 203, 205 to the irradiation surface 200 of the emitted laser beam may well be approximately 120 mm. The bus of each cylindrical lens 203, 205 and the direction of the major diameter of the linear beam are arranged to be vertical to each other.

Cylindrical lenses 206 and 204 are arranged at positions that are plane-symmetrical to the cylindrical lenses 205 and 203, and have a focal length of 150 mm. The plane includes the major diameter of the linear beam and is vertical to the plane 200. When four laser beams passing through the optical axes A, B, C and D are allowed to be incident to such an optical system, a linear beam 207 is formed as shown in an expanded view of FIG. 5. The degree of superposition of these linear beams is synthesized in accordance with the numerical formulas represented in Embodiment 1.

Next, an example of a fabrication method of a semiconductor film will be given. The semiconductor film is formed on a glass substrate. For example, a 200 nm-thick silicon oxide nitride film is formed on one of the surfaces of a 0.7 mm-thick glass substrate, and an a-Si film having a thickness of 150 nm is then formed by employing a plasma-CVD process. To improve the laser resistance of the semiconductor film, thermal annealing is conducted for the semiconductor film at 500° C. for 1 hour. Crystallization of the semiconductor film by use of the metal element may well be conducted besides thermal annealing as described in "Related Art". The irradiation condition of the optimum laser beam is substantially the same whichever film is used.

Next, an example of laser irradiation to the semiconductor film will be given. The four laser oscillators, not shown, have a maximum laser output of about 10 W. The output of each laser oscillator is adjusted to an output level suitable for laser annealing. The output is preferably from about 3 to about 10 W. The optimum output varies depending on the scanning speed of the semiconductor film. The surface of the semiconductor film is positioned to the position of the plane 200, is put on a suitable stage and is scanned in a direction vertical to the major diameter of the linear beam 207. When the output is 5 W and the scanning speed is about 50 cm/sec, a large grain crystal formation region having a width of about 1 to about 2 mm can be formed. When the area of the surface of the semiconductor film is large, large grain crystal formation regions having a width of about 1 to about 2 mm are formed in parallel, so that a large grain crystal formation region can be formed on the entire surface of the semiconductor film.

A plurality of laser beams is synthesized in accordance with the numerical formulas of Embodiment 1 and the laser beam so synthesized is irradiated to the semiconductor film. In this way, uniform laser annealing can be conducted. The invention is particularly suitable for crystallizing the semiconductor film, for improving crystallinity and for activating impurity elements. When a plurality of linear beams is partially synthesized and optimized, a laser beam that is uniform in the major diameter direction can be formed. Therefore, through-put can be improved. When crystallization of the semiconductor film is conducted by using the laser beam having such high uniformity, a crystalline semiconductor film having high uniformity can be formed and variance of electrical characteristics of TFT can be reduced. In the semiconductor device typified by the active matrix type liquid crystal display device fabricated by utilizing the invention, the invention can improve the operation characteristics of the semiconductor device and its reliability. Since the invention does not use the gas laser as in the laser annealing method according to the prior art but can use a solid laser, the invention can reduce the cost of production of the semiconductor device.

EXAMPLES

Example 1

A method of manufacturing an active matrix substrate is explained in this example using FIGS. 8A to 11. A substrate on which a CMOS circuit, a driver circuit, and a pixel portion having a TFT pixel and a holding capacity are formed together is called active matrix substrate for convenience.

First, a substrate 400 made from glass such as barium borosilicate glass or aluminum borosilicate glass is used in this example. Note that substrates such as quartz substrates, silicon substrates, metallic substrates, and stainless steel substrates having an insulating film formed on the substrate surface may also be used as the substrate 400. Further, a plastic substrate having heat resisting properties capable of enduring the processing temperatures used in this example may also be used. Because this invention can easily form a linear beam with a uniform energy distribution, it is possible that annealing the large area substrate is conducted effectively by using a plurality of linear beams.

Next, a base film 401 made from an insulating film such as a silicon oxide film, a silicon nitride film, or a silicon oxynitride film is then formed on the substrate 400 by the known method. A two layers structure is used as the base film 401 in this example, but a single layer of the above-mentioned insulating film may also be used, and a structure in which more than two layers are laminated may also be used.

Next, semiconductor layers are formed on the base film. First of all, semiconductor film is formed with a thickness of 25 to 200 nm (preferably 30 to 150 nm) by a known method (such as the sputtering method, the LPCVD method, and the plasma CVD method). Then, the semiconductor film is crystallized by a laser crystallization method. As the laser crystallization method, the laser beam irradiates to the semiconductor film by applying either Embodiment 1 or 2, or by combining Embodiments 1 and 2. It is preferable that a solid-state laser of continuous wave, a gas laser, or metallic laser is used. Note that, as the solid-state laser, there may be given a YAG laser, a YVO$_4$ laser, a YLF laser, a YAlO$_3$ laser, a glass laser, a ruby laser, an alexandrite laser, a Ti:sapphire laser, and the like. As the gas laser, an Ar laser, Kr laser, CO$_2$ laser, or the like may be used. And as the metallic laser, there may be given a helium cadmium laser of continuous wave, a copper vapor laser, or a gold vapor laser. When an excimer laser of continuous wave becomes available in practical use, it also can be applied in the invention. Of course, not only the laser crystallization method but also any other known crystallization method (RTA, the thermal crystallization method using a furnace annealing, the thermal crystallization method using metallic elements which promote crystallization) may also be combined. The semiconductor film may be an amorphous semiconductor film, a microcrystal semiconductor film or a crystalline semiconductor film. Alternatively, the semiconductor film may be a compound semiconductor film having an amorphous structure such as an amorphous silicon germanium film, an amorphous silicon carbide film.

In this example, plasma CVD method is used to form an amorphous silicon film with a thickness of 50 nm, and then the thermal crystallization method using metallic elements, which promote crystallization, and laser crystallization method are used for the amorphous silicon film. Nickel is used as a metal element, and is introduced onto the amorphous silicon film by a solution coating method. Then heat treatment is conducted at 500° C. for five hour, whereby obtaining a first crystalline silicon film. Subsequently, the laser beam shot from a continuous wave YVO$_4$ laser with output 10 W is converted into the second higher harmonic wave by a nonlinear optical element and laser annealing is performed thereon in accordance with Embodiments 1 and 2, whereby obtaining a second crystalline silicon film. Irradiating the laser beam to the first crystalline silicon film, and changing the first crystalline silicon film to the second crystalline silicon film to improve the crystallinity of the second crystalline silicon film. At this moment, about 0.01 to 100 MW/cm$^2$ (preferably 0.1 to 10 MW/cm$^2$) is necessary for the energy density. The stage is relatively moved to the laser beam at a speed of about 0.5 to 2000 cm/s, and it irradiates, and then the second crystalline silicon film is formed.

Of course, although a TFT can be formed by using the first crystalline silicon film, it is preferable that the second crystalline silicon film is used to form the TFT since the second crystalline silicon film has an improved crystallinity and electric characteristics of TFT are improved.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 150 nm using plasma CVD or sputtering. In this example, a silicon oxynitride film having a film thickness of 110 nm is formed by plasma CVD method. The gate insulating film is of course not limited to a silicon oxynitride film, and other insulating films containing silicon may be used in a single layer or in a lamination structure.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this example. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride (WF$_6$). Whichever is used, it is necessary to be able to make the film become low resistance in order to use it as a gate electrode, and it is preferable that the resistivity of the W film be made less than 20 μΩcm.

Note that although the first conductive film 408 is TaN and the second conductive film 409 is W in this example, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 8B). An ICP (Inductively Coupled Plasma) etching method is used as a first etching condition in this example. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (seem), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 8C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

A first doping process is then performed without removing the masks made of resist and the semiconductor layer is added to the impurity element which imparts n-type at a low concentration. The doping process may be performed by ion doping method or ion injection method. Ion doping is performed with process conditions in which the dosage is set from $1\times10^{13}$ to $5\times10^{14}/cm^2$, and the acceleration voltage is set between 40 to 80 keV. Doping is performed in this example with the dosage set to $1.5\times10^{13}/cm^2$, and the acceleration voltage set to 60 keV. An element belonging to the group 15, typically phosphorous (P) or arsenic (As) is used as an impurity element which imparts n-type. Phosphorous (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}/cm^3$.

Figure 9A:
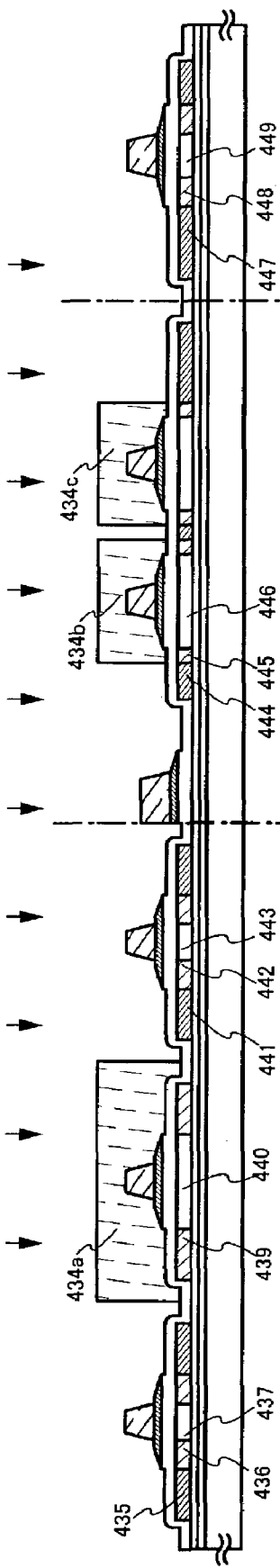
FIGS. 9A to 9C are cross-sectional views showing fabrication processes of the pixel TFT and the TFT of the driving circuit.

Next, after removing the masks made of resist, new masks 434a to 434c made of resist are formed, and the second doping process is performed in higher acceleration voltage than the first doping process. Ion doping is performed with process conditions in which the dosage is set from $1\times10^{13}$ to $1\times10^5/cm^2$, and the acceleration voltage is set between 60 to 120 keV. The doping process is performed by using the second conductive layers 428b, 430b and 432b as masks and the semiconductor layer under the tapered portion of the first conductive layer is added to the impurity element. Continuously the acceleration voltage is lowered than the second doping process, the third doping process is done, and the state of FIG. 9A is obtained. Ion doping method is performed with process conditions in which the dosage is set from $1\times10^{15}$ to $1\times10^{17}/cm^2$, and the acceleration voltage is set between 50 to 100 keV. Low concentration impurity regions 436, 442 and 448 overlapping with the first conductive layer are added to the impurity element, which imparts n-type within the range of the density of $1\times10^{18}$ to $5\times10^{19}/cm^2$ by the second doping process and the third doping process and high concentration impurity regions 435, 441, 444 and 447 are added to the impurity element, which imparts n-type within the range of the density of $1\times10^{19}$ to $5\times10^{21}/cm^2$.

Of course, the second doping process and the third doping process can be one-time doping processes by making it to a suitable acceleration voltage and it is also possible to form the low concentration impurity region and high concentration impurity region.

Figure 9B:
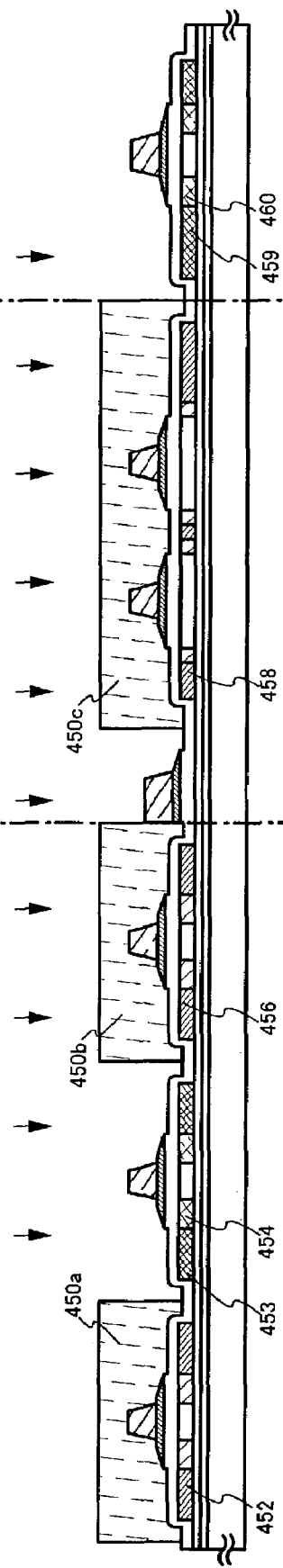
Figure 9C:
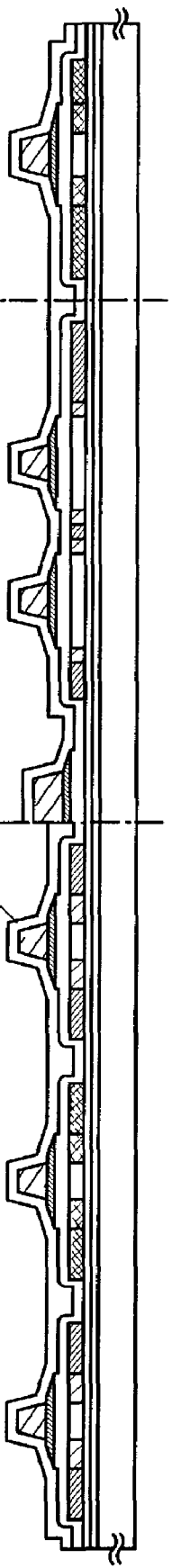

Next, after removing the masks made of resist, new masks 450a to 450c made from resist are formed and the fourth doping process is performed. Impurity regions 453, 454, 459 and 460, to which an impurity element which imparting a conductivity type opposite to that of the above one conductivity type is added, are formed in accordance with the fourth doping process in the semiconductor films which become active layers of the p-channel type TFTs. The second conductive layers 429a and 432a are used as masks with respect to the impurity element, and an impurity element which imparts p-type conductivity is added to form the impurity regions in a self-aligning manner. The impurity regions 453, 454, 459 and 460 are formed by ion doping method using diborane ($B_2H_6$) in this example (FIG. 9B). The semiconductor layers for forming the n-channel type TFT are covered with the masks 450a to 450c made of resist when the fourth doping process is performed. Phosphorous is added at different concentrations into the impurity regions 439, 447 and 448 by the first to third doping processes. However, by performing doping such that the concentration of the impurity element which imparts p-type conductivity becomes from $1\times10^{19}$ to $5\times10^{21}$ atoms/cm$^3$ in the respective regions, no problems develop in making the regions function as source regions and drain regions of the p-channel type TFT.

The impurity regions are thus formed in the respective semiconductor layers by the steps up through this point.

A first interlayer insulating film 461 is formed next after removing the masks 450*a* to 450*c* made of resist. This first interlayer insulating film 461 is formed from an insulating film containing silicon, having a thickness of 100 to 200 nm, by using plasma CVD method or sputtering method. A silicon oxynitride film having a thickness of 150 nm is formed by plasma CVD method in this example. The first interlayer insulating film 461 is of course not limited to a silicon oxynitride film, and other insulating films containing silicon may also be used, as a single layer or a lamination structure.

Subsequently, a recovery of the crystallinity of the semiconductor layer and an activation of the impurity elements added to the respective semiconductor layers are performed by irradiating the laser beam, for example. As the laser activation, the laser beam irradiates to the semiconductor film by applying either Embodiment 1 or 2 or by freely combining with these embodiments. It is preferable that a solid-state laser of continuous wave, a gas laser, or metallic laser is used. Note that, as the solid-state laser, there may be given a YAG laser of continuous wave, a YVO$_4$ laser, a YLF laser, a YAlO$_3$ laser, a glass laser, a ruby laser, an alexandrite laser, a Ti: sapphire laser, and the like. As the gas laser, there may be given an Ar laser, Kr laser, CO$_2$ laser, or the like. And as the metallic laser, there may be given a helium cadmium laser of continuous wave, a copper vapor laser, or a gold vapor laser. When an excimer laser of continuous wave becomes available in practice use, it also may be applied to the invention. At this moment, when a continuous wave laser is used, about 0.01 to 100 MW/cm$^2$ (preferably 0.1 to 10 MW/cm$^2$) is necessary for the energy density of laser beam. The substrate is relatively moved to the laser beam at a speed of about 0.5 to 2000 cm/s. And, when a pulse oscillation laser is used for the activation, it is preferable that 300 Hz of frequency and 50 to 1000 mj/cm$^2$ (typically, 50 to 500 mj/cm$^2$) of laser energy density are used. At this moment, laser beam may be overlapped by 50 to 98%. Besides laser annealing method, thermal annealing method or rapid thermal annealing method (RTA method) and the like can be applied.

Further, the activation may also be performed before the formation of a first interlayer insulating film. However, if the wiring material used is weak with respect to heat, then it is preferable to perform the activation processing after forming an interlayer insulating film (an insulating film having silicon as its main constituent, for example a silicon nitride film) in order to protect the wirings and the like, as in this example.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists.

Subsequently, a second interlayer insulating film 462 made from an inorganic insulating film material or from an organic insulating material is formed on the first interlayer insulating film 461. An acrylic resin film having a film thickness of 1.6 μm is formed in this example, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film which forms an uneven surface in this example. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film,.having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Figure 10:
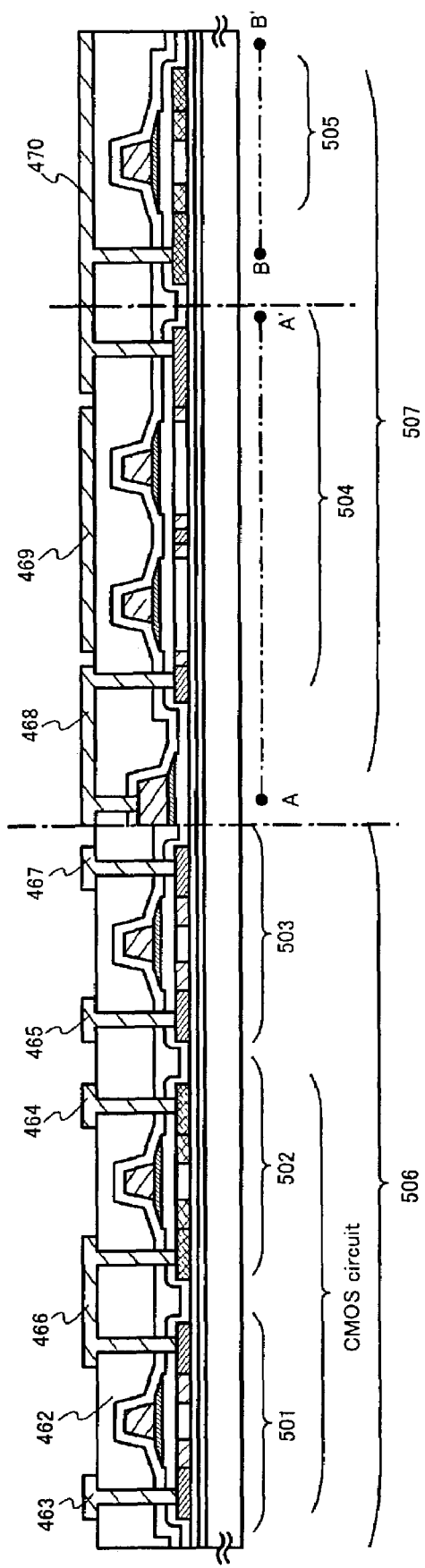
FIG. 10 is a sectional view showing a fabrication process of the pixel TFT and the TFT of the driving circuit.

Wirings 463 to 467 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, it is not limited to the is two-layer structure, the single-layer structure or the lamination structure more than three layers may also be acceptable. Further, Al and Ti are not limited to the wiring material. For example, Al and Cu are formed on TaN film, and the lamination film forming the Ti film is formed by the patterning and form wiring (FIG. 10).

Further, a pixel electrode 470, a gate wiring 469, and a connection electrode 468 are formed in a pixel portion 507. An electrical connection is formed with the pixel TFT and the source wiring (a lamination film of 443*a* and 443*b*) by the connection electrode 468. Further, the gate wiring 469 forms an electrical connection with the gate electrode of the pixel TFT. The pixel electrode 470 forms an electrical connection with the drain region 442 of the pixel TFT, and in addition, forms an electrical connection with the semiconductor layer 458 which functions as one electrode forming a storage capacitor. It is preferable to use a material having superior reflectivity, such as a film having Al or Ag as its main constituent, or a lamination film of such films, as the pixel electrode 471.

A CMOS circuit composed of an n-channel TFI 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFI 501 of the driver circuit 506 has: a channel forming region 437; the low concentration impurity region 436 (GOLD region) which overlaps with the first conductive layer 428*a* that structures a portion of the gate electrode; and the high concentration impurity region 452 which functions as a source region or a drain region. The p-channel,TFT 502, which forms the CMOS circuit with the n-channel TFT 501 and the electrode 466 by an electrical connection has: a channel forming region 440; the high concentration impurity region 453; and the impurity region 454 in which the impurity elements imparting n-type and p-type are introduced. Further, the n-channel TFT 503 has: a channel forming region 443; the low concentration impurity region 442 (GOLD region) which overlaps with the first conductive layer 430a that structures a portion of the gate electrode; and the high concentration impurity region 456 which functions as a source region or a drain region.

The pixel TFT 504 of the pixel portion has: a channel forming region 446; the low concentration impurity region 445 (LDD region) formed on the outside of the gate electrode; and the high concentration impurity region 458 which functions as a source region or a drain region. Further, an impurity element which imparts n-type and an impurity element which imparts p-type are added to the semiconductor layer which functions as one electrode of the storage capacitor 505. The storage capacitor 505 comprises an electrode (lamination of 432a and 432b) and the semiconductor layer, with the insulating film 416 functioning as a dielectric.

Figure 11:
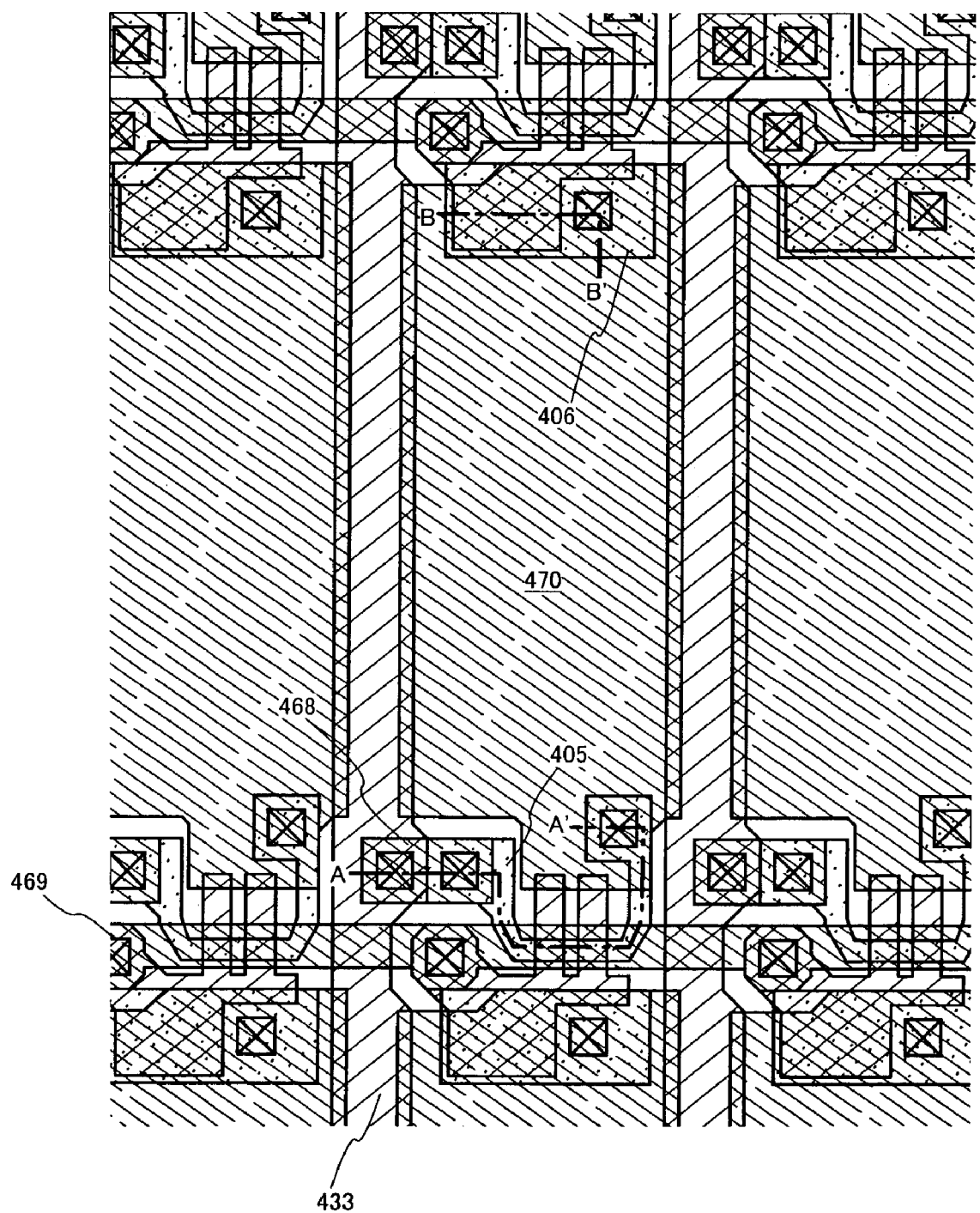
FIG. 11 is a top view showing a construction of the pixel TFT.

An upper surface diagram of the pixel portion of the active matrix substrate manufactured in this example is shown in FIG. 11. Note that the same reference symbols are used for portions corresponding to those in FIGS. 8A to 11. A chain line A–A' in FIG. 10 corresponds to a cross sectional diagram cut along a chain line A–A' within FIG. 11. Further, a chain line B–B' in FIG. 10 corresponds to a cross sectional diagram cut along a chain line B–B' within FIG. 11.

The resultant active matrix substrate made by above-mentioned method has a TFT manufactured by using a semiconductor film with characteristics approximate to those of a single crystal, further, the semiconductor film has an extremely high uniformity in characteristic, therefore, a satisfactory operation performance and reliability thereof can be obtained. When a plurality of linear beams is partially synthesized with one another and optimized, a uniform laser beam can be formed in the direction of the major diameter with the result of improvement of through-put. A crystalline semiconductor film having higher uniformity can be formed when the semiconductor film is crystallized by use of the laser beam having such high uniformity, and variance of electrical characteristics of TFT can be reduced. The invention can further improve the operation performance of semiconductor devices and their reliability in semiconductor devices typified by an active matrix type liquid crystal display device utilizing the invention. Since the invention does not use a gas laser as in the laser annealing method according to the prior art but can use a solid laser, the invention can reduce the production cost of the semiconductor devices.

Example 2

Figure 12:
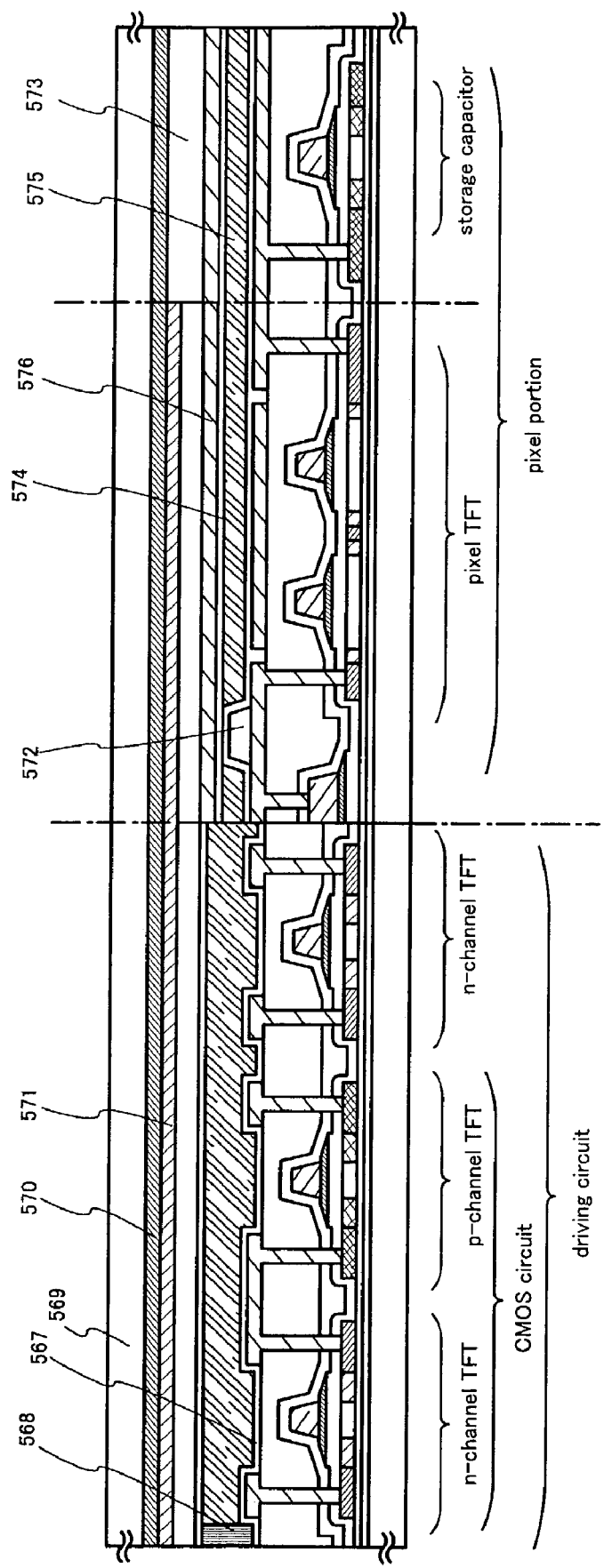
FIG. 12 is a sectional view showing a manufacturing process of an active matrix type liquid crystal display device.

A process of manufacturing a reflection type liquid crystal display device from the active matrix substrate manufactured in Example 1 is explained below in this example. FIG. 12 is used in the explanation.

An active matrix substrate in the state of FIG. 10 is first obtained in accordance with Example 1, an orientation film 567 is then formed on at least the pixel electrode 470 on the active matrix substrate of FIG. 10, and a rubbing process is performed. Note that, before forming the orientation film 567 in this example, columnar spacer 572 is formed in desired positions by patterning an organic resin film, such as an acrylic resin film and the like, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Example 1 is used in this example. Therefore, with the top view of the pixel portion of Example 1 shown in FIG. 11, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask and the like.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 12 is thus completed. The active matrix substrate or the opposing substrate is then cut into a desired shape if necessary. In addition, a polarizing plate (not shown in the figure) is attached to only the opposing substrate. An FPC is then attached using a known technique.

The resultant liquid crystal display device made by above-mentioned method has a TFT manufactured by using a semiconductor film with characteristics approximate to those of a single crystal, further, the semiconductor film has an extremely high uniformity in characteristic, therefore, a satisfactory operation performance and reliability of the liquid crystal display device can be obtained. When a plurality of linear beams is partially synthesized with one another and optimized, a uniform laser beam can be formed in the direction of the major diameter with the result of improvement of through-put. A crystalline semiconductor film having higher uniformity can be formed when the semiconductor film is crystallized by use of the laser beam having such high uniformity, and variance of electrical characteristics of TFT can be reduced. The invention can further improve the operating characteristic and reliability of the liquid crystal display device manufactured by utilizing the invention. Since the invention does not use a gas laser as in the laser annealing method according to the prior art but can use a solid laser, the invention can reduce the production cost of the liquid crystal display devices. Such a liquid crystal display device can be used as a display portion in various kinds of electronic equipment.

Note that it is possible to freely combine this example with Embodiments 1 and 2.

Example 3

In this example, an example of manufacturing a light emitting device by using a manufacturing method of TFT that is used for forming an active matrix substrate in Example 1 is shown. In this specification, the light emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a light emitting layer), an anode, and a cathode. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In addition, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the-hole injection layer, the light emitting layer, and the cathode layer are sequentially laminated or a structure that the anode layer, the hole injection layer, the light emitting layer, the hole transportation layer, and the cathode layer etc. are sequentially laminated.

Figure 13:
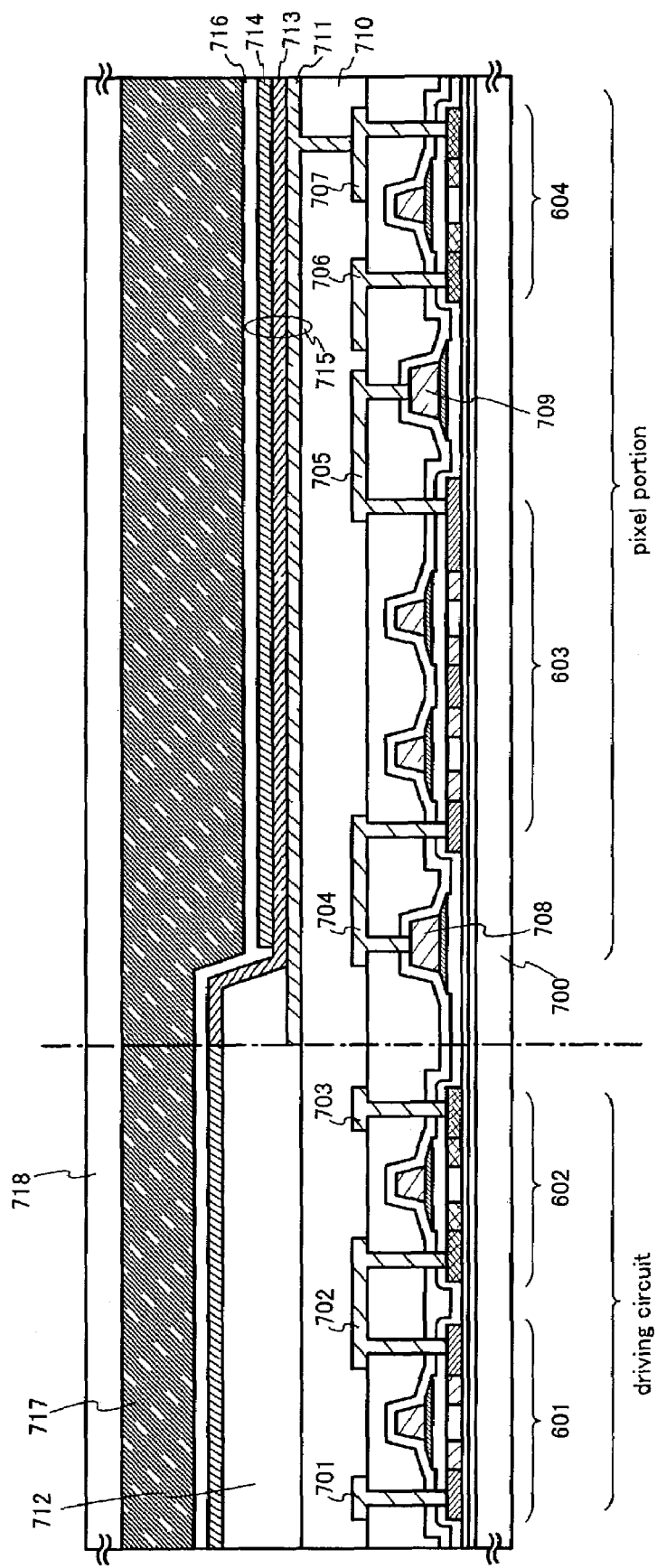
FIG. 13 is a structural sectional view of a driving circuit and a pixel portion of a light-emitting device.

FIG. 13 is a sectional view of a light emitting device of this example. In FIG. 13, the switching TFT 603 provided on the substrate 700 is formed by using the n-channel TFT 503 of FIG. 10. Consequently, concerning the explanation of the structure, it is satisfactory to refer the explanation on the n-channel TFT 503.

The driver circuit provided on the substrate 700 is formed by using the CMOS circuit of FIG. 10. Consequently, concerning the explanation of the structure, it is satisfactory to refer the explanation on the n-channel TFT 601 and p-channel TFT 602. Incidentally, although this example is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 10. Consequently, concerning the explanation of the structure, it is satisfactory to refer to the explanation on the p-channel TFT 502. Incidentally, although this example is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this example, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 13. The bank 712 may be formed by patterning an insulating film or organic resin film containing silicon having 100 to 400 nm.

Incidentally, because the bank 712 is an insulating film, caution must be paid to element electrostatic breakdown during deposition. In this example added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A light emitting layer 713 is formed on the pixel electrode 711. Incidentally, although FIG. 13 shows only one pixel, this example separately forms the light-emitting layer correspondingly to the respective colors of R (red), G (green) and B (blue). Meanwhile, in this example is formed a low molecular weight organic light emitting material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic light emitting material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this example was shown the example in which a low molecular weight organic light emitting material is used for a light-emitting layer, it is possible to use an intermediate organic light emitting material and a high molecular weight organic light emitting material. Furthermore, an organic light-emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of about 100 nm on it as a light emitting layer may be good. The luminescence wave length can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light-emitting layer 713. In this example, as the conductive film, used is an alloy film of aluminum and lithium. Of course, a known MgAg film (alloy film of magnesium and silver) may be used. As the cathode material may be used a conductive film of an element belonging to the periodictable group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light-emitting lo layer 713 low in heat resistance. Meanwhile, the DLC film, having a high blocking effect to oxygen, can suppress the light-emitting layer 713 from oxidizing. Consequently, the problem of oxidation can be prevented in the light-emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this example, for the cover member 718 used is a glass substrate, quartz substrate or plastic substrate (including a plastic film) having carbon films (preferably diamond-like carbon films) formed on the both surfaces thereof. In addition to the carbon film, the aluminum film (such as AlON, AlN, and AlO), SiN and the like are used.

Thus, completed is a light emitting device having a structure as shown in FIG. 13. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601 and 602, a switching TFT (n-channel TFT) 603 and a current control TFT (p-channel TFT) 604 are formed on the substrate 700.

Furthermore, as was explained using FIG. 13, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this example shows only the configuration of the pixel portion and driver circuit. However, according to the manufacturing process in this example, besides these, it is possible to form on the same insulating member such logic circuits as a signal division circuit, a D/A converter, an operation amplifier, a γ-correction circuit or the like. Furthermore, a memory or microprocessor can be formed.

The resultant light emitting device formed above-mentioned method has a TFT manufactured by using a semiconductor film with characteristics approximate to those of a single crystal, further, the semiconductor film has an extremely high uniformity in characteristic, therefore, a satisfactory operating characteristic and reliability of the light emitting device can be obtained. When a plurality of linear beams is partially synthesized with one another and optimized, a uniform laser beam can be formed in the direction of the major diameter with the result of improvement of through-put. A crystalline semiconductor film having higher uniformity can be formed when the semiconductor film is crystallized by use of the laser beam having such high uniformity, and variance of electrical characteristics of TFT can be reduced. The operation performance and reliability of the light emitting realized by utilizing the invention can be improved. Since the invention does not use a gas laser as in the laser annealing method according to the prior art but can use a solid laser, the invention can reduce the production cost of the light emitting devices. Such a light emitting device can be used as a display portion in various kinds of electronic equipment.

Incidentally, this example can be freely combined with Embodiments 1 and 2.

Example 4

Various semiconductor devices (active matrix type liquid crystal display device, active matrix type light emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 14A to 14F, 15A to 15D, and 16A to 16C show one of its examples.

Figure 14A:
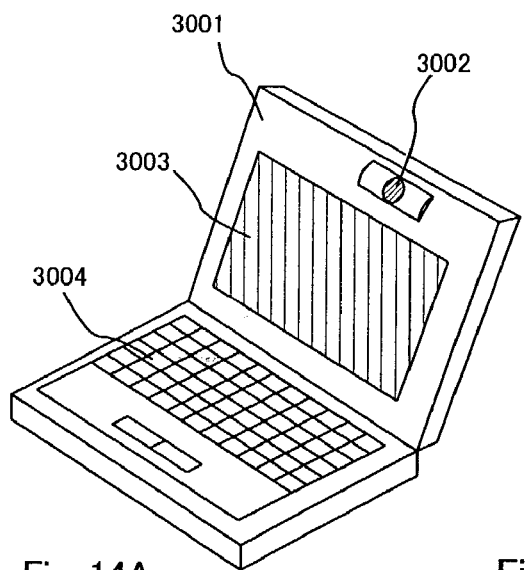
FIGS. 14A to 14F show examples of electronic devices.

FIG. 14A shows a personal computer which includes a main body 3001, an image input portion 3002, a display portion 3003, a keyboard 3004 and the like. The personal computer of the present invention is completed by applying the semiconductor device manufactured by the present invention to the display portion 3003.

Figure 14B:
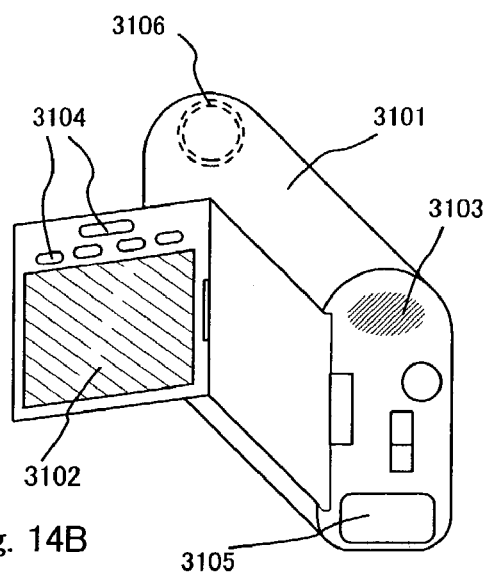

FIG. 14B shows a video camera which includes a main body 3101, a display portion 3102, a sound input portion 3103, operating switches 3104, a battery 3105, an image receiving portion 3106 and the like. The video camera of the present invention completed by applying the semiconductor device manufactured by the present invention to the display portion 3102.

Figure 14C:
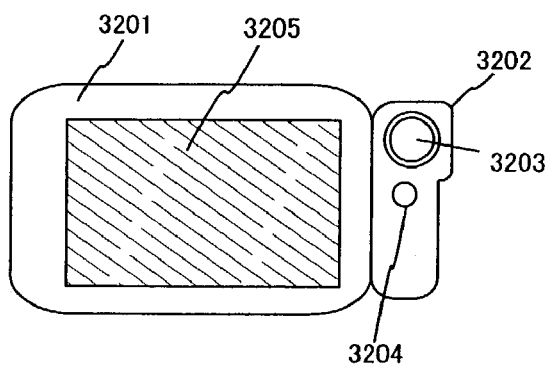

FIG. 14C shows a mobile computer which includes a main body 3201, a camera portion 3202, an image receiving portion 3203, an operating switch 3204, a display portion 3205 and the like. The mobile computer of the present invention is completed by applying the semiconductor device manufactured by the present invention to the display portion 3205.

Figure 14D:
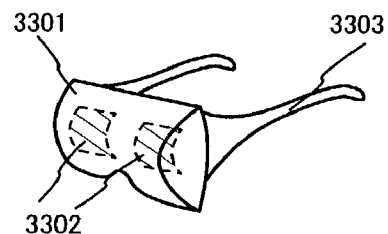

FIG. 14D shows a goggle type display which includes a main body 3301, a display portion 3302, arm portions 3303 and the like. The display portion 3302 uses a flexible substrate as a substrate, and the goggle type display is manufactured by bending the display portion 3302. Further, a lightweight and thin goggle type display is realized. The goggle type display of the present invention is completed by applying the semiconductor device manufactured by the present invention to the display portion 3302.

Figure 14E:
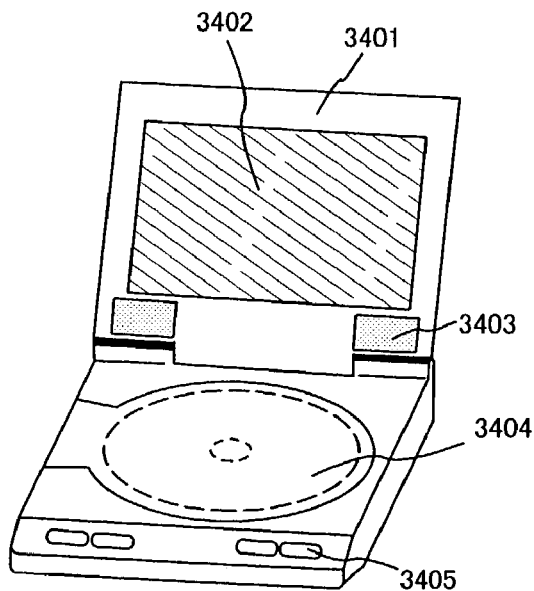

FIG. 14E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention is completed by applying the semiconductor device manufactured by the present invention to the display portion 3402.

Figure 14F:
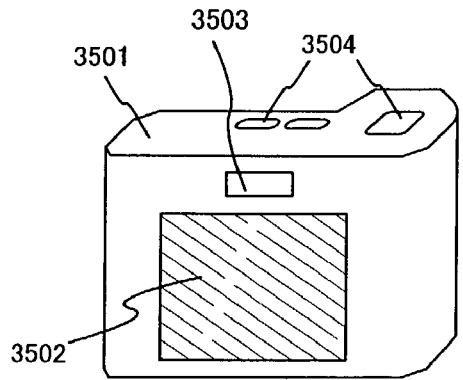

FIG. 14F shows a digital camera which includes a body 3501, a display portion 3502, an eyepiece portion 3503, operating switches 3504, an image receiving portion (not shown) and the like. The digital camera of the present invention is completed by applying the semiconductor device manufactured by the present invention to the display portion 3502.

Figure 15A:
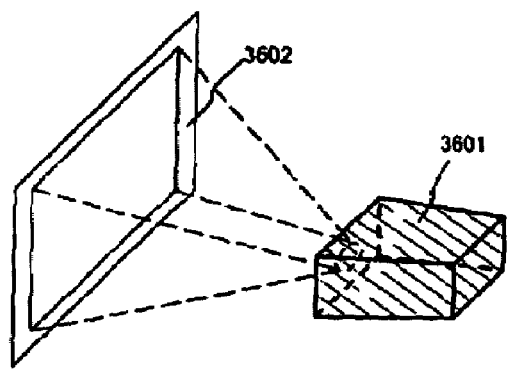
FIGS. 15A to 15D show further examples of the electronic device.

FIG. 15A shows a front type projector which includes a projection device 3601, a screen 3602 and the like. The front type projector is completed by applying a liquid crystal display device 3808 which constitutes a part of the projection device 3601 and other driver circuits.

Figure 15B:
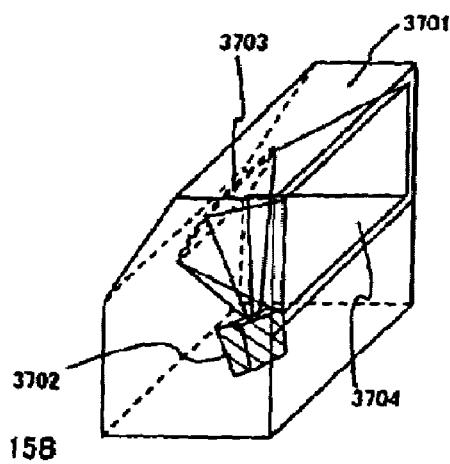

FIG. 15B shows a rear type projector which includes a main body 3701, a projection device 3702, a mirror 3703, a screen 3704 and the like. The rear type projector is completed by applying the liquid crystal display device 3808 which constitutes a part of the projection device 3702 and other driver circuits.

Figure 15C:
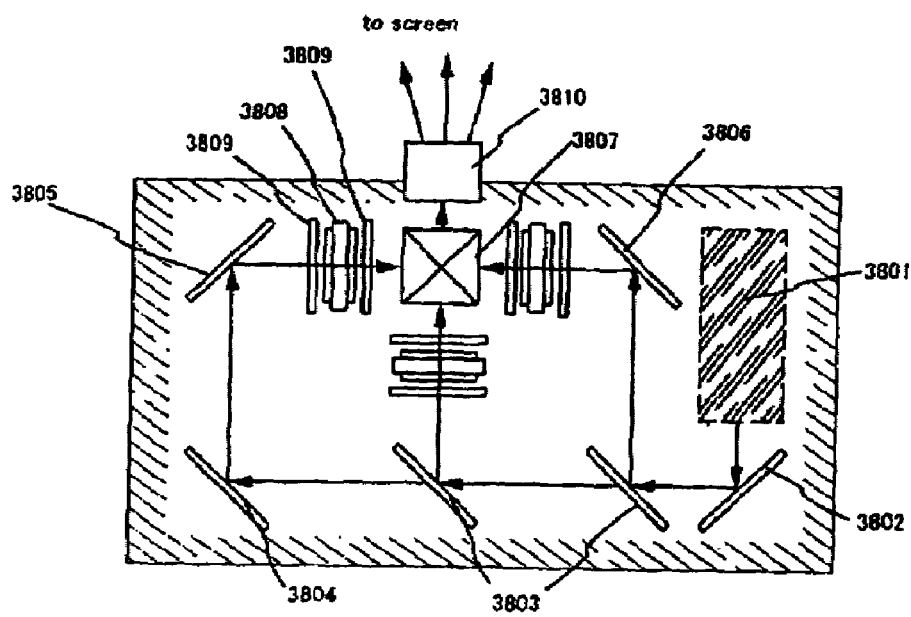

FIG. 15C shows one example of the structure of each of the projection devices 3601 and 3702 which are respectively shown in FIGS. 15A and 15B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Present example is an example of a three-plate type, but it is not limited to this example and may also be of a single-plate type. In addition, those who embody the invention may appropriately dispose an optical system such as an optical lens, a film having a polarization function, a film for adjusting phase difference, an IR film or the like in the path indicated by arrows in FIG. 15C.

Figure 15D:
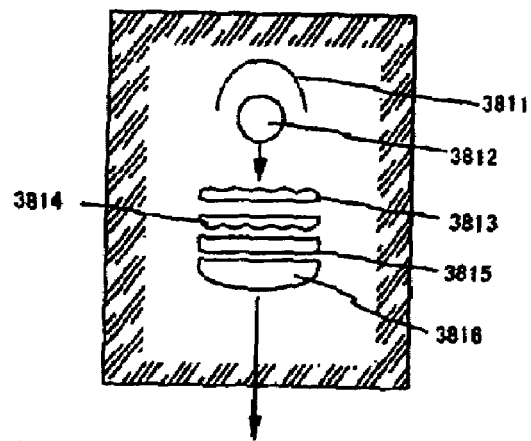

FIG. 15D is a view showing one example of the structure of the light source optical system 3801 shown in FIG. 15C. In this example, the light source optical system 3801 is made of a reflector 3811, a light source 3812, lens arrays 3813 and 3814, a polarizing conversion element 3815 and a condenser lens 3816. Incidentally, the light source optical system shown in FIG. 15D is one example, and the invention is not particularly limited to the shown construction. For example, those whose embody the invention may appropriately dispose an optical system such as an optical lens, a film having a polarization function, a film for adjusting phase difference, an IR film or the like.

The projector shown in FIGS. 15A to 15D is of the type using a transparent type of electro-optical device, but there is not shown an example in which the invention is applied to a reflection type of electro-optical device and a light emitting device.

Figure 16A:
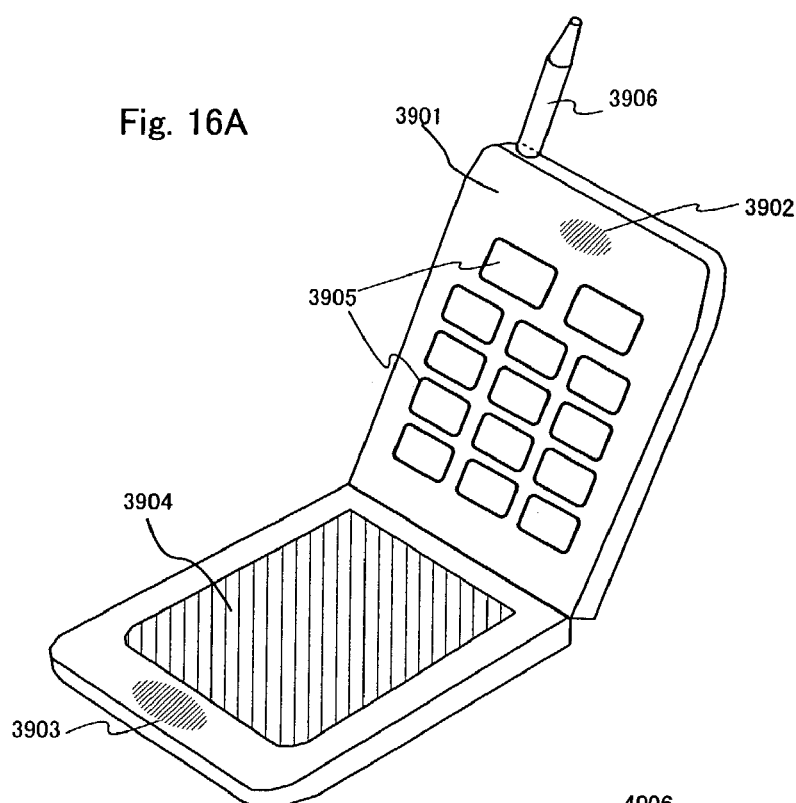
FIGS. 16A to 16C show still further examples of the electronic device.

FIG. 16A shows a mobile telephone which includes a main body 3901, a sound output portion 3902, a sound input portion 3903, a display portion 3904, operating switches 3905, an antenna 3906 and the like. The mobile telephone of the present invention is completed by applying the semiconductor device manufactured by the present invention to the display portion 3904.

Figure 16B:
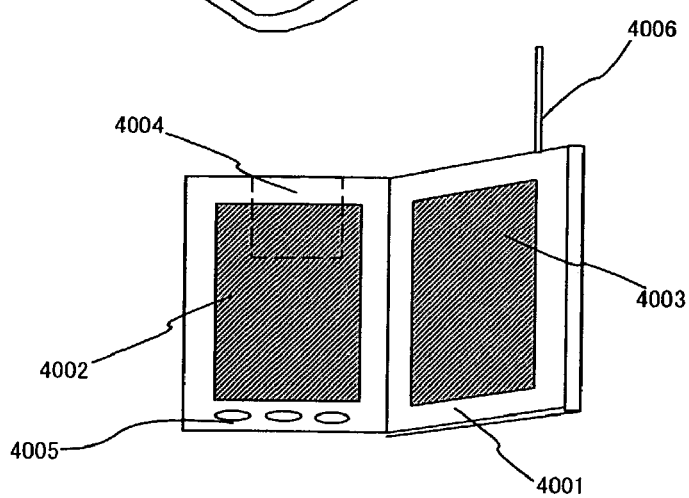

FIG. 16B shows a mobile book (electronic book) which includes a main body 4001, display portions 4002 and 4003, a storage medium 4004, operating switches 4005, an antenna 4006 and the like. The mobile book of the present invention is completed by applying the semiconductor device manufactured by the present invention to the display portions 4002 and 4003. The mobile book can be made in a size identical to a pocket book, therefore, it is ultra-portable.

Figure 16C:
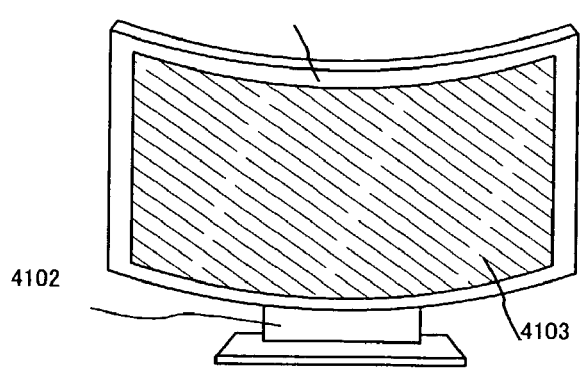

FIG. 16C shows a display which includes a main body 4101, a support base 4102, a display portion 4103 and the like. The display portion 4103 is made by using a flexible substrate, thereby realizing a lightweight and thin display. Further, the display portion 4103 can be bent. The display of the present invention is completed by applying the semiconductor device manufactured by the present invention to the display portion 4103. The invention is particularly advantageous to a large-screen display, and is advantageous to a display having a diagonal size of 10 inches or more (particularly, 30 inches or more).

The resultant electronic apparatus made by above-mentioned method has a TFT manufactured by using a semiconductor film with characteristics approximate to those of a single crystal, further, the semiconductor film has an extremely high uniformity in characteristic, therefore, a satisfactory operation performance and reliability of the electronic apparatus can be obtained. When a plurality of linear beams is partially synthesized with one another and optimized, a uniform laser beam can be formed in the direction of the major diameter with the result of improvement of through-put. A crystalline semiconductor film having higher uniformity can be formed when the semiconductor film is crystallized by use of the laser beam having such high uniformity, and variance of electrical characteristics of TFT can be reduced. The invention can further improve the operation performance and reliability of the semiconductor device typified by the active matrix type liquid crystal display device manufactured by utilizing the invention. Since the invention does not use a gas laser as in the laser annealing method according to the prior art but can use a solid laser, the invention can reduce the production cost of the semiconductor devices.

In addition, the range of applications of the invention is extremely wide, and the invention can be applied to any category of electronic apparatus. Electronic apparatus according to the invention can be realized by using a construction made of a combination of arbitrary ones of Embodiments 1 to 2, and Examples 1, 2 or Examples 1 and 3.

Employment of the constitution of the invention offers fundamentally significant meanings as described below.

(a) The Laser annealing can be conducted more uniformly when a plurality of laser beams satisfying the relation of the invention is irradiated to an object to be irradiated.
(b) The object to be irradiated is uniformly annealed. In particular, the invention is particularly suitable for crystallizing the semiconductor film, for improving crystallinity and for activating impurity elements.
(c) A plurality of linear beams is partially synthesized with one another, which makes it possible to improve the throughput.
(d) Since the invention does not use a gas laser as in the laser annealing method according to the prior art but can use a solid laser, the invention can reduce the production cost of the semiconductor devices.
(e) The semiconductor device as represented by the liquid crystal display device of the active matrix type makes it possible to improve operation characteristics and reliability yet satisfying the above advantages. It is further allowed to produce the semiconductor device at a decreased cost.

What is claimed is:

1. A laser irradiation apparatus comprising:
at least first and second laser oscillators; and
means for extending a first laser beam emitted from the first oscillator, the first laser beam having an ellipsoid spot shape;
means for extending a second laser beam emitted from the second laser oscillator, the second laser beam having an ellipsoid spot shape,
wherein the means for extending the first laser beam and the means for extending the second laser beam are provided obliquely to an irradiation surface,
wherein one edge of the first laser beam overlaps with one edge of the second laser beam in the longitudinal direction of the first and second laser beams, and a linear laser beam is formed by the overlapped first and second laser beams on the irradiation surface,
wherein the following relation is satisfied when an $e^{-2}$ width of a major diameter of each of the extended first and second laser beams on the irradiation surface is a, an width of a minor diameter is b, an X axis is drawn in parallel with the major diameter, a Y axis is drawn in parallel with the minor diameter, and center coordinates of the first and second laser beams are (x, y) and (x', y'), respectively:

$((x-x')/a)^2 + ((y-y')/b)^2 < 0.72^2$, and wherein a, b, x, x', y, and y' are positive numbers.

2. A laser irradiation apparatus according to claim 1, wherein the $e^{-2}$ width of the major diameter and the center coordinates (x, y) and (x', y') of the first and second laser beams satisfy the relation:

$|x-x'|/a > 0.52$.

3. A laser irradiation apparatus according to claim 1, wherein each of the first and second laser oscillators is selected from a group consisting of continuous wave gas laser, solid laser and metal laser.

4. A laser irradiation apparatus according to claim 1, wherein the $e^{-2}$ width b of the minor diameter is not greater than 50 μm.

5. A laser irradiation apparatus according to claim 1, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

6. A laser irradiation apparatus comprising:
at least first and second laser oscillators; and
means for extending a first laser beam emitted from the first oscillator, the first laser beam having a rectangular spot shape;
means for extending a second laser beam emitted from the second laser oscillator, the second laser beam having a rectangular spot shape,
wherein the means for extending the first laser beam and the means for extending the second laser beam are provided obliquely to an irradiation surface,
wherein one edge of the first laser beam overlaps with one edge of the second laser beam in the longitudinal direction of the first and second laser beams, and a linear laser beam is formed by the overlapped first and second laser beams on the irradiation surface,
wherein the following relation is satisfied when an $e^{-2}$ width of a major diameter of each of the extended first and second laser beams on the irradiation surface is a, an $e^{-2}$ width of a minor diameter is b, an X axis is drawn in parallel with the major diameter, a Y axis is drawn in parallel with the minor diameter, and center coordinates of the first and second laser beams are (x, y) and (x', y'), respectively:

$|y-y'|/b < 0.72$ and $|x-x'| < a$, wherein an energy distribution of the extended first and second laser beams in the direction of the major diameter is uniform, and an energy distribution in the direction of the minor diameter is a Gaussian distribution, and
wherein a, b, x, x', y, and y' are positive numbers.

7. A laser irradiation apparatus according to claim 6, wherein the $e^{-2}$ width of the major diameter and the center coordinates (x, y) and (x', y') of the first and second laser beams satisfy the relation:

$|x-x'|/a > 0.52$.

8. A laser irradiation apparatus according to claim 6, wherein each of the first and second laser oscillators is selected from a group consisting of continuous wave gas laser, solid laser and metal laser.

9. A laser irradiation apparatus according to claim 6, wherein the $e^{-2}$ width b of the minor diameter is not greater than 50 μm.

10. A laser irradiation apparatus according to claim 6, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

11. A laser irradiation apparatus comprising:
at least first and second laser oscillators; and
means for extending a first laser beam emitted from the first oscillator, the first laser beam having a rectangular spot shape;
means for extending a second laser beam emitted from the second laser oscillator, the second laser beam having a rectangular spot shape,
wherein the means for extending the first laser beam and the means for extending the second laser beam are provided obliquely to an irradiation surface, wherein one edge of the first laser beam overlaps with one edge of the second laser beam in the longitudinal direction of the first and second laser beams, and a linear laser beam is formed by the overlapped first and second laser beams on the irradiation surface, wherein the following relation is satisfied when an $e^{-2}$ width of a major diameter of each of the extended first and second laser beams on the irradiation surface is a, an width of a minor diameter is b, an X axis is drawn in parallel with the major diameter, a Y axis is drawn in parallel with the minor diameter, and center coordinates of the first and second laser beams are (x, y) and (x', y'), respectively:

$|x-x'|/a > 0.72$ and $|y-y'| < b$, wherein an energy distribution of the extended first and second laser beams in the direction of the minor diameter is uniform, and an energy distribution in the direction of the major diameter is a Gaussian distribution, and wherein a, b, x, x', y, and y' are positive numbers.

12. A laser irradiation apparatus according to claim 11, wherein the $e^{-2}$ width of the major diameter and the center coordinates (x, y) and (x', y') of the first and second laser beams satisfy the relation:

$|x-x'|/a > 0.52$.

13. A laser irradiation apparatus according to claim 11, wherein each of the first and second laser oscillators is selected from a group consisting of continuous wave gas laser, solid laser and metal laser.

14. A laser irradiation apparatus according to claim 11, wherein the $e^{-2}$ width b of the minor diameter is not greater than 50 μm.

15. A laser irradiation apparatus according to claim 11, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

16. A laser irradiation apparatus comprising:

at least first and second laser oscillators; and means for extending a first laser beam emitted from the first oscillator, the first laser beam having a rectangular spot shape;

means for extending a second laser beam emitted from the second laser oscillator, the second laser beam having a rectangular spot shape, wherein the means for extending the first laser beam and the means for extending the second laser beam are provided obliquely to an irradiation surface, wherein one edge of the first laser beam overlaps with one edge of the second laser beam in the longitudinal direction of the first and second laser beams, and a linear laser beam is formed by the overlapped first and second laser beams on the irradiation surface, wherein the following relation is satisfied when an $e^{-2}$ width of a major diameter of each of the extended first and second laser beams on the irradiation surface is a, an width of a minor diameter is b, an X axis is drawn in parallel with the major diameter, a Y axis is drawn in parallel with the minor diameter, and center coordinates of the first and second laser beams are (x, y) and (x', y'), respectively:

$|x-x'|/a < 0.72$ and $|y-y'|/b < 0.72$, wherein an energy distribution of the extended first and second laser beams in the direction of the major diameter is a Gaussian distribution, and an energy distribution in the direction of the minor diameter is a Gaussian distribution, and wherein a, b, x, x', y, and y' are positive numbers.

17. A laser irradiation apparatus according to claim 16, wherein the $e^{-2}$ width of the major diameter and the center coordinates (x, y) and (x', y') of the first and second laser beams satisfy the relation:

$|x-x'|/a > 0.52$.

18. A laser irradiation apparatus according to claim 16, wherein each of the first and second laser oscillators is selected from a group consisting of continuous wave gas laser, solid laser and metal laser.

19. A laser irradiation apparatus according to claim 16, wherein the $e^{-2}$ width b of the minor diameter is not greater than 50 μm.

20. A laser irradiation apparatus according to claim 16, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

21. A laser irradiation apparatus comprising:

at least first and second laser oscillators; and means for extending first and second laser beams emitted from the first and second laser oscillators, respectively, the first laser beam having a rectangular spot shape and the second laser beam having a round spot shape, wherein one edge of the first laser beam overlaps with one edge of the second laser beam in the longitudinal direction of the first and second laser beams, and a linear laser beam is formed by overlapped first and second laser beams on an irradiation surface, wherein the following relation is satisfied when an $e^{-2}$ width of a major diameter of each of the extended first and second laser beams on the irradiation surface is a, an width of a minor diameter is b, an X axis is drawn in parallel with the major diameter, a Y axis is drawn in parallel with the minor diameter, and center coordinates of the first and second laser beams are (x, y) and (x', y'), respectively:

$((x-x')/a)^2 + ((y-y')/b)^2 < 0.72^2$, and wherein a, b, x, x', y, and y' are positive numbers.

22. A laser irradiation apparatus according to claim 21, wherein the $e^{-2}$ width of the major diameter and the center coordinates (x, y) and (x', y') of the first and second laser beams satisfy the relation:

$|x-x'|/a > 0.52$.

23. A laser irradiation apparatus according to claim 21, wherein each of the first and second laser oscillators is selected from a group consisting of continuous wave gas laser, solid laser and metal laser.

24. A laser irradiation apparatus according to claim 21, wherein the $e^{-2}$ width b of the minor diameter is not greater than 50 μm.

25. A laser irradiation apparatus according to claim 21, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

26. A laser irradiation method comprising:
extending first and second laser beams emitted from at least first and second laser oscillators wherein each of the first and second laser beams is an ellipsoid shape having an $e^{-2}$ width of a major diameter a and an $e^{-2}$ width of a minor diameter b; and
directing each of the first and second laser beams to an irradiation surface through a lens provided obliquely to the irradiation surface so that one edge of the first laser beam overlaps with one edge of the second laser beam in the longitudinal direction of the first and second laser beams,
wherein the following relation is satisfied when center coordinates of the first and second laser beams are (x, y) and (x', y'), respectively, an X axis is drawn in parallel with said major diameter, and Y axis is drawn in parallel with the minor diameter:

$((x-x')/a)^2+((y-y')/b)^2<0.72^2$, and wherein a, b, x, x', y, and y' are positive numbers.

27. A laser irradiation method according to claim 26, wherein the $e^{-2}$ width a of the major diameter and the center coordinates (x, y) and (x', y') of the first and second laser beams satisfy the following relation:

$|x-x'|/a>0.52$.

28. A laser irradiation method according to claim 26, wherein each of the first and second laser oscillators is selected from the group consisting of continuous wave gas laser, solid laser and metal laser.

29. A laser irradiation method according to claim 26, wherein the $e^{-2}$ width b of the minor diameter is not greater than 50 µm.

30. A laser irradiation method according to claim 26, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

31. A laser irradiation method comprising:
extending first and second laser beams emitted from at least first and second laser oscillators wherein each of the first and second laser beams is a rectangular shape having an $e^{-2}$ width of a major diameter a and an $e^{-2}$ width of a minor diameter b; and
directing the first and second laser beams to an irradiation surface through a lens provided obliquely to the irradiation surface so that one edge of the first laser beam overlaps with one edge of the second laser beam in the longitudinal direction of the first and second laser beams,
wherein the following relation is satisfied when center coordinates of the first and second laser beams are (x, y) and (x', y'), respectively, an X axis is drawn in parallel with said major diameter, and Y axis is drawn in parallel with the minor diameter:

$|y-y'|/b<0.72$ and $|x-x'|<a$, wherein an energy distribution of the linear beam in the direction of the major diameter is uniform and an energy distribution in the direction of the minor diameter is a Gaussian distribution, and
wherein a, b, x, x', y, and y' are positive numbers.

32. A laser irradiation method according to claim 31, wherein the $e^{-2}$ width a of the major diameter and the center coordinates (x, y) and (x', y') of the first and second laser beams satisfy the following relation:

$|x-x'|/a>0.52$.

33. A laser irradiation method according to claim 31, wherein each of the first and second laser oscillators is selected from the group consisting of continuous wave gas laser, solid laser and metal laser.

34. A laser irradiation method according to claim 31, wherein the $e^{-2}$ width b of the minor diameter is not greater than 50 µm.

35. A laser irradiation method according to claim 31, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

36. A laser irradiation method comprising:
extending first and second laser beams emitted from at least first and second laser oscillators wherein each of the first and second laser beams is a rectangular shape having an $e^{-2}$ width of a major diameter a and an $e^{-2}$ width of a minor diameter b; and
directing the first and second laser beams to an irradiation surface through a lens provided obliquely to the irradiation surface so that one edge of the first laser beam overlaps with one edge of the second laser beam in the longitudinal direction of the first and second laser beams,
wherein the following relation is satisfied when center coordinates of the first and second laser beams are (x, y) and (x', y'), respectively, an X axis is drawn in parallel with said major diameter, and Y axis is drawn in parallel with the minor diameter:

$|x-x'|/a<0.72$ and $|y-y'|<b$, wherein an energy distribution of the linear beam in the direction of the minor diameter is uniform and an energy distribution in the direction of the major diameter is a Gaussian distribution, and
wherein a, b, x, x', y, and y' are positive numbers.

37. A laser irradiation method according to claim 36, wherein the $e^{-2}$ width a of the major diameter and the center coordinates (x, y) and (xi, y') of the first and second laser beams satisfy the following relation:

$|x-x'|/a>0.52$.

38. A laser irradiation method according to claim 36, wherein each of the first and second laser oscillators is selected from the group consisting of continuous wave gas laser, solid laser and metal laser.

39. A laser irradiation method according to claim 36, wherein the $e^{-2}$ width b of the minor diameter is not greater than 50 µm.

40. A laser irradiation method according to claim 36, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

41. A laser irradiation method comprising:
extending first and second laser beams emitted from at least first and second laser oscillators wherein each of the first and second laser beams is an ellipsoid shape having an $e^{-2}$ width of a major diameter a and an $e^{-2}$ width of a minor diameter b; and directing the first and second laser beams to an irradiation surface through a lens provided obliquely to the irradiation surface so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$|x-x'|/a<0.72$ and $|y-y'|/b<0.72$, wherein an energy distribution of the linear beam in the direction of the minor diameter is a Gaussian distribution and an energy distribution in the direction of the major diameter is a Gaussian distribution, and wherein a, b, x, x', y, and y' are positive numbers.

42. A laser irradiation method according to claim 41, wherein the $e^{-2}$ width a of the major diameter and the center coordinates (x, y) and (x', y') of the first and second laser beams satisfy the following relation:

$|x-x'|/a>0.52$.

43. A laser irradiation method according to claim 41, wherein each of the first and second laser oscillators is selected from the group consisting of continuous wave gas laser, solid laser and metal laser.

44. A laser irradiation method according to claim 41, wherein the $e^{-2}$ width b of the minor diameter is not greater than 50 μm.

45. A laser irradiation method according to claim 41, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

46. A laser irradiation method comprising:

extending first and second laser beams emitted from at least first and second laser oscillators wherein the first laser beam is a round shape and the second laser beam is a rectangular shape, each of which having an $e^{-2}$ width of a major diameter a and an $e^{-2}$ width of a minor diameter b; and directing the first and second laser beams to an irradiation surface so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$((x-x')/a)^2+((y-y')/b)^2<(0.72)^2$, and wherein a, b, x, x', y, and y' are positive numbers.

47. A laser irradiation method according to claim 46, wherein the $e^{-2}$ width a of the major diameter and the center coordinates (x, y) and (x', y') of the first and second laser beams satisfy the following relation:

$|x-x'|/a>0.52$.

48. A laser irradiation method according to claim 46, wherein each of the first and second laser oscillators is selected from the group consisting of continuous wave gas laser, solid laser and metal laser.

49. A laser irradiation method according to claim 46, wherein the $e^{-2}$ width b of the minor diameter is not greater than 50 μm.

50. A laser irradiation method according to claim 46, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

51. A manufacturing method of a semiconductor device comprising:

forming a semiconductor film comprising silicon over a substrate;

extending first and second laser beams emitted from at least first and second laser oscillators wherein each of the first and second laser beams is an ellipsoid shape having an $e^{-2}$ width of a major diameter a and an $e^{-2}$ width of a minor diameter b; and crystallizing the semiconductor film by directing the first and second laser beams to the semiconductor film so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$((x-x')/a)^2+((y-y')/b)^2<0.72^2$, and wherein a, b, x, x', y, and y' are positive numbers.

52. A manufacturing method of a semiconductor device according to claim 51, wherein the $e^{-2}$ width a of the major diameter and the center coordinates (x, y) and (x', y') of the overlapping laser beams satisfy the relation:

$|x-x'|/a>0.52$.

53. A manufacturing method of a semiconductor device according to claim 51, wherein each of the first and second laser oscillators is selected from the group consisting of continuous wave gas laser, solid laser and metal laser.

54. A manufacturing method of a semiconductor device according to claim 51, wherein the $e^{-2}$ width b of the minor diameter is not greater than 50 μm.

55. A manufacturing method of a semiconductor device according to claim 51, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

56. A manufacturing method of a semiconductor device comprising:

forming a semiconductor film comprising silicon over a substrate;

extending first and second laser beams emitted from at least first and second laser oscillators wherein each of the first and second laser beams is a rectangular shape having an $e^{-2}$ width of a major diameter a and an $e^{-2}$ width of a minor diameter b; and crystallizing the semiconductor film by directing the first and second laser beams to the semiconductor film through a lens provided obliquely to the semiconductor film so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$|y-y'|/b<0.72$ and $|x-x'|<a$, wherein an energy distribution of the linear beam in the direction of the major diameter is uniform and an energy distribution in the direction of the minor diameter is a Gaussian distribution, and wherein a, b, x, x', y, and y' are positive numbers.

57. A manufacturing method of a semiconductor device according to claim 56, wherein the $e_{-2}$ width a of the major diameter and the center coordinates (x, y) and (x', y') of the overlapping laser beams satisfy the relation:

$|x-x'|/a>0.52$.

58. A manufacturing method of a semiconductor device according to claim 56, wherein each of the first and second laser oscillators is selected from the group consisting of continuous wave gas laser, solid laser and metal laser.

59. A manufacturing method of a semiconductor device according to claim 56, wherein the $e^{-2}$ width b of the minor diameter is not greater than 50 μm.

60. A manufacturing method of a semiconductor device according to claim 56, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

61. A manufacturing method of a semiconductor device comprising:

forming a semiconductor film comprising silicon over a substrate;

extending first and second laser beams emitted from at least first and second laser oscillators wherein each of the first and second laser beams is a rectangular shape having an $e^{-2}$ width of a major diameter a and an $e^{-2}$ width of a minor diameter b; and crystallizing the semiconductor film by directing the first and second laser beams to the semiconductor film through a lens provided obliquely to the semiconductor film so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$|x-x'|/a<0.72$ and $|y-y'|<b$, wherein an energy distribution of the linear beam in the direction of the minor diameter is uniform and an energy distribution in the direction of the major diameter is a Gaussian distribution, and wherein a, b, x, x', y, and y' are positive numbers.

62. A manufacturing method of a semiconductor device according to claim 61, wherein the $e^{-2}$ width a of the major diameter and the center coordinates (x, y) and (x', y') of the overlapping laser beams satisfy the relation:

$|x-x'|/a>0.52$.

63. A manufacturing method of a semiconductor device according to claim 61, wherein each of the first and second laser oscillators is selected from the group consisting of continuous wave gas laser, solid laser and metal laser.

64. A manufacturing method of a semiconductor device according to claim 61, wherein the $e^{-2}$ width b of the minor diameter is not greater than 50 μm.

65. A manufacturing method of a semiconductor device according to claim 61, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

66. A manufacturing method of a semiconductor device comprising:

forming a semiconductor film comprising silicon over a substrate;

extending first and second laser beams emitted from at least first and second laser oscillators wherein each of the first and second laser beams is an ellipsoid shape having an $e^{-2}$ width of a major diameter a and an $e^{-2}$ width of a minor diameter b; and crystallizing the semiconductor film by directing the first and second laser beams to the semiconductor film so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$|x-x'|/a<0.72$ and $|y-y'|/b<0.72$, wherein an energy distribution of the linear beam in the direction of the major diameter is a Gaussian distribution and an energy distribution in the direction of the minor diameter is a Gaussian distribution, and wherein a, b, x, x', y, and y' are positive numbers.

67. A manufacturing method of a semiconductor device according to claim 66, wherein the $e^{-2}$ width a of the major diameter and the center coordinates (x, y) and (x', y') of the overlapping laser beams satisfy the relation:

$|x-x'|/a>0.52$.

68. A manufacturing method of a semiconductor device according to claim 66, wherein each of the first and second laser oscillators is selected from the group consisting of continuous wave gas laser, solid laser and metal laser.

69. A manufacturing method of a semiconductor device according to claim 66, wherein the $e^{-2}$ width b of the minor diameter is not greater than 50 μm.

70. A manufacturing method of a semiconductor device according to claim 66, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

71. A manufacturing method of a semiconductor device comprising:

forming a semiconductor film comprising silicon over a substrate;

extending first and second laser beams emitted from at least first and second laser oscillators wherein the first laser beam is a round shape and the second laser beam is a rectangular shape, each of which having an $e^{-2}$ width of a major diameter a and an $e^{-2}$ width of a minor diameter b; and directing the first and second laser beams to an irradiation surface so that one edge of the first laser beam overlaps with one edge of the second laser beam in the longitudinal direction of the first and second laser beams, wherein a linear laser beam is formed by overlapped first and second laser beams on the irradiation surface, wherein the following relation is satisfied when center coordinates of the first and second laser beams are (x, y) and (x', y'), respectively, an X axis is drawn in parallel with said major diameter, and Y axis is drawn in parallel with the minor diameter:

$$((x-x')/a)^2 + ((y-y')/b)^2 < (0.72)^2, \text{ and}$$

wherein a, b, x, x', y, and y' are positive numbers.

72. A manufacturing method of a semiconductor device according to claim 71, wherein the $e^{-2}$ width a of the major diameter and the center coordinates (x, y) and (x', y') of the overlapping laser beams satisfy the relation:

$$|x-x'|/a > 0.52.$$

73. A manufacturing method of a semiconductor device according to claim 71, wherein each of the first and second laser oscillators is selected from the group consisting of continuous wave gas laser, solid laser and metal laser.

74. A manufacturing method of a semiconductor device according to claim 71, wherein the $e^{-2}$ width b of the minor diameter is not greater than 50 μm.

75. A manufacturing method of a semiconductor device according to claim 71, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

76. A laser irradiation apparatus according to claim 1, wherein the following relation is satisfied when an $e^{-2}$ width of a major diameter of each of the extended first and second laser beams on the irradiation surface is a, an $e^{-2}$ width of a minor diameter is b, an X axis is drawn in parallel with the major diameter, a Y axis is drawn in parallel with the minor diameter, and center coordinates of the first and second laser beams are (x, y) and (x', y'), respectively:

$$((x-x')/a)^2 + ((y-y')/b)^2 < 0.63^2, \text{ and}$$

wherein a, b, x, x', y, and y' are positive numbers.

77. A laser irradiation apparatus according to claim 6, wherein the following relation is satisfied when an $e^{-2}$ width of a major diameter of each of the extended first and second laser beams on the irradiation surface is a, an &2 width of a minor diameter is b, an X axis is drawn in parallel with the major diameter, a Y axis is drawn in parallel with the minor diameter, and center coordinates of the first and second laser beams are (x, y) and (x', y'), respectively:

$$((x-x')/a)^2 + ((y-y')/b)^2 < 0.63^2, \text{ and}$$

wherein a, b, x, x', y, and y' are positive numbers.

78. A laser irradiation apparatus according to claim 11, wherein the following relation is satisfied when an $e^{-2}$ width of a major diameter of each of the extended first and second laser beams on the irradiation surface is a, an $e^{-2}$ width of a minor diameter is b, an X axis is drawn in parallel with the major diameter, a Y axis is drawn in parallel with the minor diameter, and center coordinates of the first and second laser beams are (x, y) and (x', y'), respectively:

$$((x-x')/a)^2 + ((y-y')/b)^2 < 0.63^2, \text{ and}$$

wherein a, b, x, x', y, and y' are positive numbers.

79. A laser irradiation apparatus according to claim 16, wherein the following relation is satisfied when an $e^{-2}$ width of a major diameter of each of the extended first and second laser beams on the irradiation surface is a, an $e^{-2}$ width of a minor diameter is b, an X axis is drawn in parallel with the major diameter, a Y axis is drawn in parallel with the minor diameter, and center coordinates of the first and second laser beams are (x, y) and (x', y'), respectively:

$$((x-x')/a)^2 + ((y-y')/b)^2 < 0.63^2, \text{ and}$$

wherein a, b, x, x', y, and y' are positive numbers.

80. A laser irradiation apparatus according to claim 1, wherein an angle between an optical axis of the first laser beam and the irradiation surface is the same as that between an optical axis of the second laser beam and the irradiation surface.

81. A laser irradiation apparatus according to claim 6, wherein an angle between an optical axis of the first laser beam and the irradiation surface is the same as that between an optical axis of the second laser beam and the irradiation surface.

82. A laser irradiation apparatus according to claim 11, wherein an angle between an optical axis of the first laser beam and the irradiation surface is the same as that between an optical axis of the second laser beam and the irradiation surface.

83. A laser irradiation apparatus according to claim 16, wherein an angle between an optical axis of the first laser beam and the irradiation surface is the same as that between an optical axis of the second laser beam and the irradiation surface.

84. A laser irradiation apparatus according to claim 26, wherein an angle between an optical axis of the first laser beam and the irradiation surface is the same as that between an optical axis of the second laser beam and the irradiation surface.

85. A laser irradiation apparatus according to claim 31, wherein an angle between an optical axis of the first laser beam and the irradiation surface is the same as that between an optical axis of the second laser beam and the irradiation surface.

86. A laser irradiation apparatus according to claim 36, wherein an angle between an optical axis of the first laser beam and the irradiation surface is the same as that between an optical axis of the second laser beam and the irradiation surface.

87. A laser irradiation apparatus according to claim 41, wherein an angle between an optical axis of the first laser beam and the irradiation surface is the same as that between an optical axis of the second laser beam and the irradiation surface.

88. A laser irradiation method comprising:

extending first and second laser beams emitted from at least first and second laser oscillators wherein each of the first and second laser beams is a rectangular shape having an $e^{-2}$ width of a major diameter a and an $e^{-2}$ width of a minor diameter b; and directing the first and second laser beams to an irradiation surface through a lens provided obliquely to the irradiation surface so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$|x-x'|/a<0.72$ and $|y-y'|/b<0.72$, wherein an energy distribution of the linear beam in the direction of the minor diameter is a Gaussian distribution and an energy distribution in the direction of the major diameter is a Gaussian distribution, and wherein a, b, x, x', y, and y' are positive numbers.

89. A laser irradiation method according to claim 88, wherein the $e^{-2}$ width a of the major diameter and the center coordinates (x, y) and (x', y') of the first and second laser beams satisfy the following relation:

$|x-x'|/a>0.52$.

90. A laser irradiation method according to claim 88, wherein each of the first and second laser oscillators is selected from the group consisting of continuous wave gas laser, solid laser and metal laser.

91. A laser irradiation method according to claim 88, wherein the $e^{-2}$ width b of the minor diameter is not greater than 50 μm.

92. A laser irradiation method according to claim 88, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

93. A manufacturing method of a semiconductor device comprising:

forming a semiconductor film comprising silicon over a substrate;

extending first and second laser beams emitted from at least first and second laser oscillators wherein each of the first and second laser beams is a rectangular shape having an $e^{-2}$ width of a major diameter a and an $e^{-2}$ width of a minor diameter b; and crystallizing the semiconductor film by directing the first and second laser beams to the semiconductor film through a lens provided obliquely to the semiconductor film so that one edge of the first laser beam overlaps with one edge of the second laser beam in the longitudinal direction of the first and second laser beams, wherein the following relation is satisfied when center coordinates of the first and second laser beams are (x, y) and (x', y'), respectively, an X axis is drawn in parallel with said major diameter, and Y axis is drawn in parallel with the minor diameter:

$|x-x'|/a<0.72$ and $|y-y'|/b<0.72$, wherein an energy distribution of the linear beam in the direction of the major diameter is a Gaussian distribution and an energy distribution in the direction of the minor diameter is a Gaussian distribution, and wherein a, b, x, x', y, and y' are positive numbers.

94. A manufacturing method of a semiconductor device according to claim 93, wherein the $e^{-2}$ width a of the major diameter and the center coordinates (x, y) and (x', y') of the overlapping laser beams satisfy the relation:

$|x-x'|/a>0.52$.

95. A manufacturing method of a semiconductor device according to claim 93, wherein each of the first and second laser oscillators is selected from the group consisting of continuous wave gas laser, solid laser and metal laser.

96. A manufacturing method of a semiconductor device according to claim 93, wherein the $e^{-2}$ width b of the minor diameter is not greater than 50 μm.

97. A manufacturing method of a semiconductor device according to claim 93, wherein each of the first and second laser oscillators is selected from the group consisting of Ar laser, Kr laser, $CO_2$ laser, YAG laser, $YVO_4$ laser, YLF laser, $YalO_3$ laser, $Y_2O_3$ laser, glass laser, ruby laser, alexandrite laser, Ti: sapphire laser, helium cadmium laser, copper vapor laser and gold vapor laser.

98. A laser irradiation apparatus according to claim 1, wherein the direction of the first and second laser beams are oblique to the irradiation surface.

99. A laser irradiation apparatus according to claim 6, wherein the direction of the first and second laser beams are oblique to the irradiation surface.

100. A laser irradiation apparatus according to claim 11, wherein the direction of the first and second laser beams are oblique to the irradiation surface.

101. A laser irradiation apparatus according to claim 16, wherein the direction of the first and second laser beams are oblique to the irradiation surface.

102. A laser irradiation apparatus according to claim 21, wherein the direction of the first and second laser beams are oblique to the irradiation surface.

103. A laser irradiation method according to claim 26, wherein the direction of the first and second laser beams are oblique to the irradiation surface.

104. A laser irradiation method according to claim 31, wherein the direction of the first and second laser beams are oblique to the irradiation surface.

105. A laser irradiation method according to claim 36, wherein the direction of the first and second laser beams are oblique to the irradiation surface.

106. A laser irradiation method according to claim 41, wherein the direction of the first and second laser beams are oblique to the irradiation surface.

107. A laser irradiation method according to claim 88, wherein the direction of the first and second laser beams are oblique to the irradiation surface.

108. A laser irradiation method according to claim 46, wherein the direction of the first and second laser beams are oblique to the irradiation surface.

109. A manufacturing method of a semiconductor device according to claim 51, wherein the direction of the first and second laser beams are oblique to the irradiation surface.

110. A manufacturing method of a semiconductor device according to claim 56, wherein the direction of the first and second laser beams are oblique to the irradiation surface.

111. A manufacturing method of a semiconductor device according to claim 61, wherein the direction of the first and second laser beams are oblique to the irradiation surface.

112. A manufacturing method of a semiconductor device according to claim 66, wherein the direction of the first and second laser beams are oblique to the irradiation surface.

113. A manufacturing method of a semiconductor device according to claim 93, wherein the direction of the first and second laser beams are oblique to the irradiation surface.

114. A manufacturing method of a semiconductor device according to claim 71, wherein the direction of the first and second laser beams are oblique to the irradiation surface.

115. A laser irradiation apparatus according to claim 88, wherein an angle between an optical axis of the first laser beam and the irradiation surface is the same as that between an optical axis of the second laser beam and the irradiation surface.

* * * * *

UNITED STATES PATENT AND TRADEMARK OFFICE
CERTIFICATE OF CORRECTION

| | | |
|---|---|---|
| PATENT NO. | : 7,113,527 B2 | Page 1 of 1 |
| APPLICATION NO. | : 10/324078 | |
| DATED | : September 26, 2006 | |
| INVENTOR(S) | : Koichiro Tanaka | |

It is certified that error appears in the above-identified patent and that said Letters Patent is hereby corrected as shown below:

In column 3, line 3; column 5, line 59 and column 10, line 16 of the specification and in claims 5, 10, 15, 20, 25, 30, 35, 40, 45, 50, 55, 60, 65, 70, 75, 92 and 97, change the text "YalO$_3$" to --YAlO$_3$--.

Signed and Sealed this

Twenty-first Day of October, 2008

JON W. DUDAS
*Director of the United States Patent and Trademark Office*